(12) United States Patent
Osaka et al.

(10) Patent No.: US 8,049,303 B2
(45) Date of Patent: Nov. 1, 2011

(54) SEMICONDUCTOR DEVICE WITH POWER NOISE SUPPRESSION

(75) Inventors: Hideki Osaka, Kokubunji (JP); Tatsuya Saito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 55 days.

(21) Appl. No.: 12/107,758

(22) Filed: Apr. 22, 2008

(65) Prior Publication Data
US 2008/0258259 A1  Oct. 23, 2008

(30) Foreign Application Priority Data

Apr. 23, 2007  (JP) .................................. 2007-112574

(51) Int. Cl.
*H01L 45/00* (2006.01)

(52) U.S. Cl. ........ 257/532; 257/685; 257/686; 257/724; 257/904; 257/924; 257/E23.141; 257/E23.144; 257/E23.145; 257/E25.029

(58) Field of Classification Search .......... 257/723–725, 257/728, E23.141–E23.145, 685–686, 904, 257/924, E25.029; 438/107, 109
See application file for complete search history.

(56) References Cited

U.S. PATENT DOCUMENTS

| | | | |
|---|---|---|---|
| 6,873,035 | B2 | 3/2005 | Watanabe et al. |
| 7,233,065 | B2 | 6/2007 | Watanabe et al. |
| 2002/0074669 | A1* | 6/2002 | Watanabe et al. ............. 257/777 |
| 2007/0105304 | A1 | 5/2007 | Kasai et al. |

FOREIGN PATENT DOCUMENTS

| | | |
|---|---|---|
| JP | 2002-170920 A | 6/2002 |
| JP | 2002-184933 A | 6/2002 |
| JP | 2003-332515 A | 11/2003 |
| JP | 2005-340555 A | 12/2005 |
| JP | 2006-173407 A | 6/2006 |
| WO | WO 2007/036994 A1 | 4/2007 |

* cited by examiner

*Primary Examiner* — A. Sefer
*Assistant Examiner* — Ermias Woldegeorgis
(74) *Attorney, Agent, or Firm* — Miles & Stockbridge P.C.

(57) ABSTRACT

A semiconductor chip and a semiconductor device mounting the semiconductor chip capable of increasing a capacitance of a capacitor without reducing the number of signal bumps or power bumps of a package and the number of C4 solder balls of the semiconductor chip, and achieving a stable power supply with suppressing fluctuations of power at a resonance frequency without a limitation in a position to mount a capacitor for lowering noise of a signal transceiving interface block. In the semiconductor device, a via hole is provided to the semiconductor chip, a power-supply electrode connected to the via hole is provided to a back surface of the semiconductor chip, and a capacitor is mounted to the electrode on the back surface. And, a high-resistance material is used for a material of a power-supply via hole inside the semiconductor chip, thereby increasing the resistance and lowering the Q factor.

1 Claim, 19 Drawing Sheets

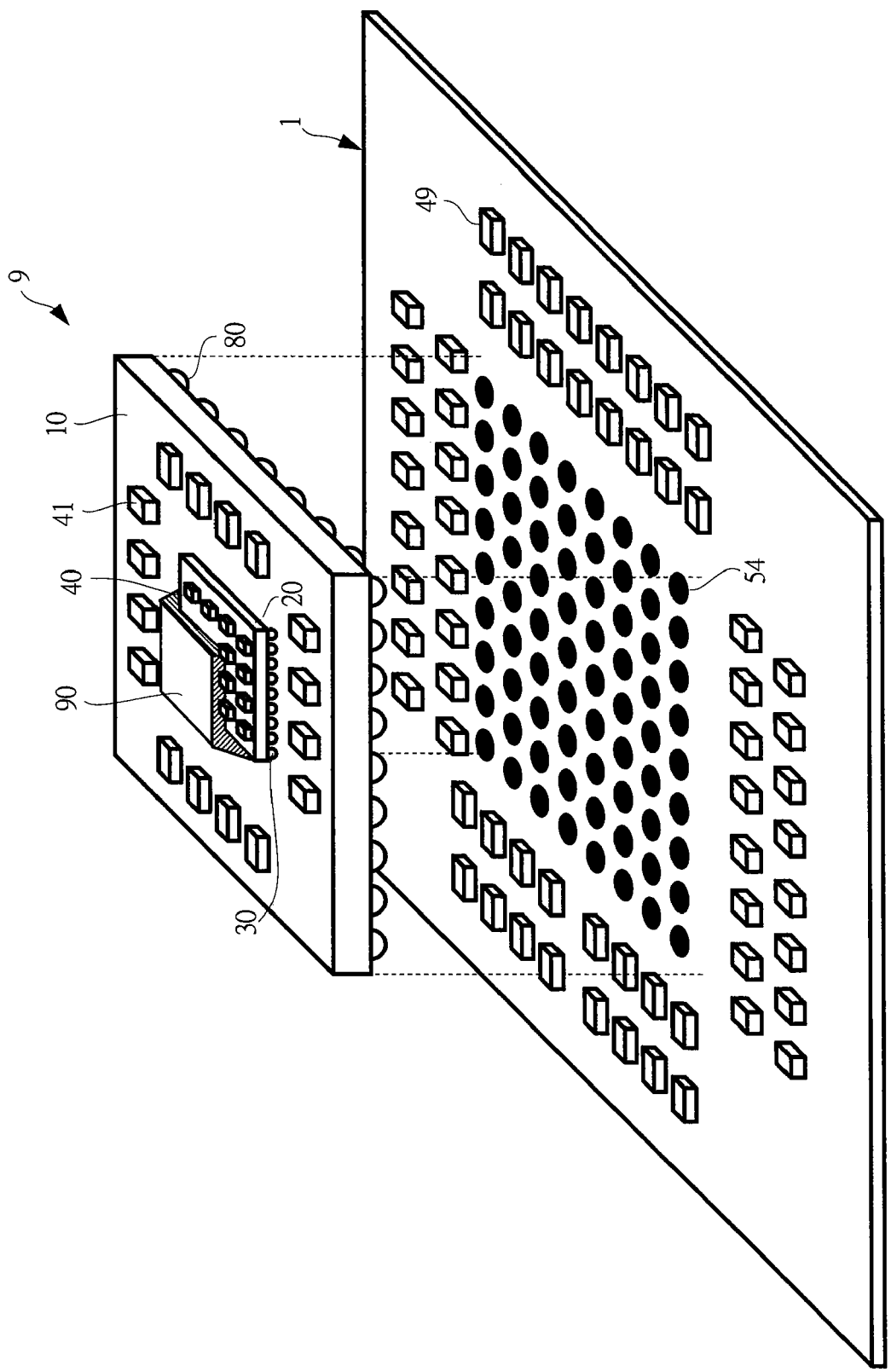

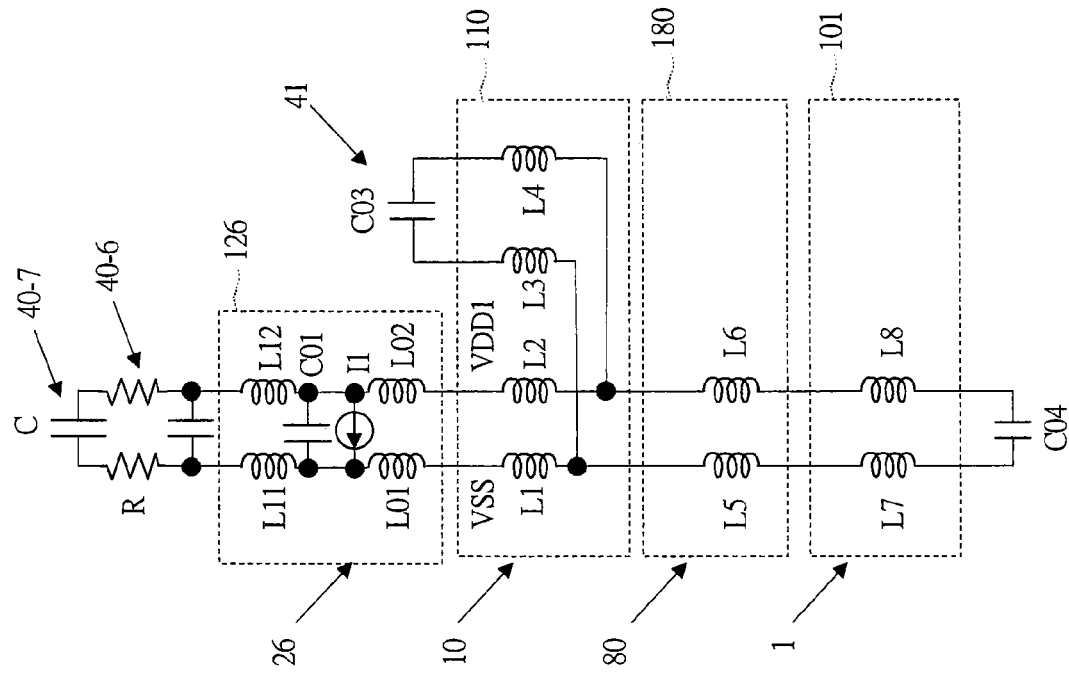
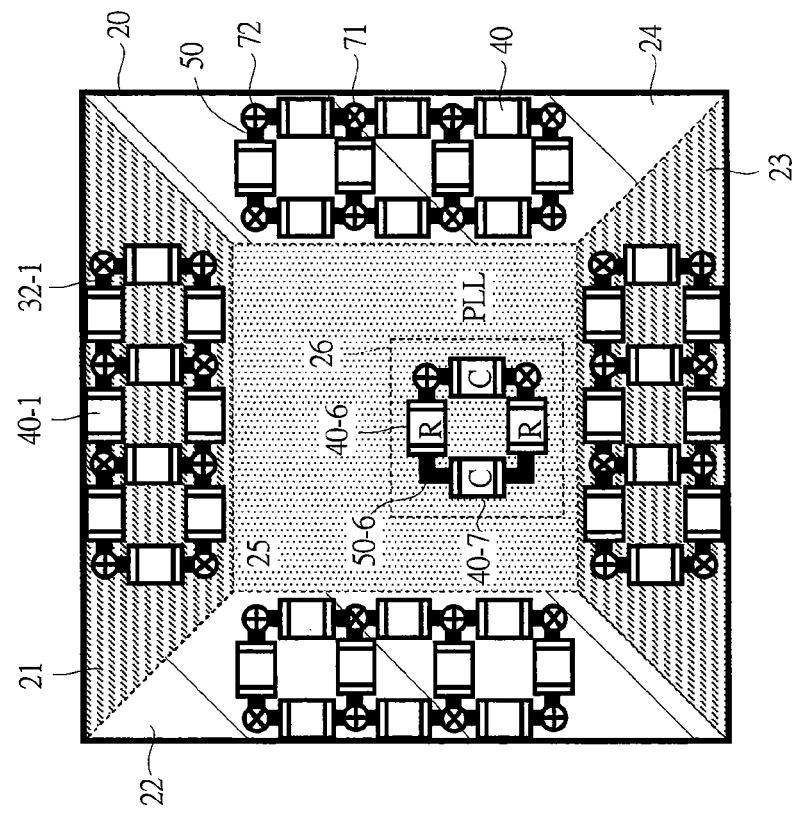

SEMICONDUCTOR DEVICE WITH POWER NOISE SUPPRESSION

CROSS-REFERENCE TO RELATED APPLICATION

The present application claims priority from Japanese Patent Application No. JP 2007-112574 filed on Apr. 23, 2007, the content of which is hereby incorporated by reference into this application.

TECHNICAL FIELD OF THE INVENTION

The present invention relates to a technique for a semiconductor chip and a semiconductor device mounting the same. More particularly, the present invention relates to a technique effectively applied to a semiconductor device mounting a functional circuit and application products of the semiconductor device including information processing devices such as a personal computer, server, router and storage, and a processor and a memory embedded in information home appliances such as an information in-vehicle terminal, television and camera.

BACKGROUND OF THE INVENTION

According to developments, improvement in speed and improvement in functionality of semiconductor device (LSI) processes, the power noise of LSI has been increased. This is because a power voltage is decreased as the semiconductor manufacturing process proceeds, and the flowing current is increased when the power consumption is same. More particularly, when denoting the power current by I, power consumption by W and power source by V, to decrease one of I and V increases the other with same power consumption W from the relation of W=IV.

Further, along with advances in semiconductor manufacturing processes, clock frequency has been increased and therefore the induced electromotive force (V) becomes as the following.

$$V = L(dI/dt) \quad \text{(Equation 1).}$$

Here, "L" denotes an inductance of a power supply system, "I" denotes a current waveform of a power distribution system, and d/dt denotes temporal differentiation. According to the relation of (Equation 1), switching time of signals becomes shorter in LSIs improved in speed, and thus, fluctuating time of the power current (I) becomes shorter. Consequently, large power noise will be generated even with a small inductance (L) component of the power supply system.

To respond to the generation of power noise, there are techniques for arranging a decoupling capacitor on a surface of a circuit wiring layer of a semiconductor chip in a semiconductor device as disclosed in Japanese Patent Application Laid-Open Publication No. 2002-170920 (Patent Document 1) and Japanese Patent Application Laid-Open Publication No. 2003-332515 (Patent Document 2). In addition, there is a technique for mounting a decoupling capacitor on a same layer of solder balls of a package as disclosed in Japanese Patent Application Laid-Open Publication No. 2006-173407 (Patent Document 3).

SUMMARY OF THE INVENTION

Mean while, as the inventors of the present invention have studied about the techniques of the above Patent Documents 1 to 3, the following has been found as a result. Descriptions will be made with reference to FIG. 17 to FIG. 19B. FIG. 17 is a diagram for describing outline of Patent Documents 1 and 2 (Prior Art 1), FIG. 18 is a diagram for describing outline of Patent Document 3 (Prior Art 2), and FIGS. 19A and 19B are diagrams for describing equivalent circuits of the outlines of Patent Documents 1 to 3.

A semiconductor device of FIG. 17 is an example where a decoupling capacitor (or simply denoted as capacitor) 42a is arranged on a surface of a circuit wiring layer in a semiconductor chip (or simply denoted as chip) 20 in the semiconductor device 9. The semiconductor device 9 includes the semiconductor chip 20, and a circuit wiring layer 60 is formed on the semiconductor chip 20. An electrode 51 provided on the circuit wiring layer 60 is connected to an electrode 52 on a semiconductor package (or simply denoted as package) 10 which is a semiconductor interposer via a C4 solder ball 30.

And, the decoupling capacitor 42a is mounted on the same surface of the circuit wiring layer 60 of the semiconductor chip 20. An effect of the capacitor 42a is to suppress noise generated together with a power current fluctuation by decreasing an impedance of the power-supply system of a power supplied to the semiconductor chip 20. Since the decoupling capacitor is mounted to the circuit wiring layer 60 of the semiconductor chip 20, the semiconductor chip 20 and the circuit wiring layer 60 can be connected by the shortest distance, thereby obtaining effects that an inductance of the power distribution system can be lowered and the power noise (V) taking part in (Equation 1) can be largely reduced.

However, a wide area is required to the wiring layer 60 of the semiconductor chip 20 for mounting the capacitor. In the case where the semiconductor chip 20 is connected to the package 10 by the C4 solder ball 30, if the structure is such that quadrates having a bump (electrode) pitch of 0.2 mm pitch are spreading all over the area (face-centered cubic structure), when mounting a capacitor having a size of 0.6 mm long and 0.3 mm wide, total 8 bumps of 4×2 rows should be removed from the wiring layer 60 of the semiconductor chip 20 as to the bump pitch, even when one row is provided blank. This means, the more the number of capacitors increases, the more the number of bumps to be removed increases.

There is a problem as a first problem that the number of signal bumps or power bumps connectable to the package is largely reduced due to mounting the capacitor to the package, or a problem that the number of the C4 solder balls is largely reduced due to mounting the capacitor to a chip circuit surface. This can be solved by widen the area of the semiconductor chip 20 itself if the required number of C4 pads cannot be ensured due to mounting the capacitor, but this leads to an increase in cost.

FIG. 19A is a diagram showing an equivalent circuit of the Prior Art 1 where the capacitor is mounted on a surface of the semiconductor chip circuit shown in FIG. 17. An equivalent circuit of the semiconductor chip 20 is denoted by 120. The equivalent circuit 120 has an on-chip capacitance (C01) which the semiconductor chip 20 has and a current source (I1) to be connected to C01. It has been known that an operative transistor in the semiconductor chip 20 generates an AC current shown by the current source, and a static transistor works as a capacitance.

A connection between the equivalent circuit 120 of the semiconductor chip 20 and an equivalent circuit 101 of a printed circuit board 1 is made via an equivalent circuit 142a of the capacitor 42a, an equivalent circuit 110 of the package 10, and an equivalent circuit 180 of a solder ball 80, and they are generally connected to a capacitor 42 having a large capacitance which is mounted to the printed circuit board 1.

An equivalent circuit 149 of the capacitor 49 is shown by a series connected circuit of a capacitance (C04), a parasitic inductance (ESL04), and a parasitic resistance (ESR04).

Herein, power noise induced by the fluctuating current source (I1) occurs due to fluctuating currents flowing through inductances in respective parts, and an equivalent circuit of the part where noise is generated is shown by an inductor which is an origin of the induced electromotive force. Further, a parasitic inductance of the capacitor 49a is denoted by ESL02 and a resistance component of the capacitor is denoted by ESR02, and a parasitic inductance of the capacitor 42a is denoted by ESL04 and a resistance component of the capacitor 49 is denoted by ESR04. Note that, although there would actually exist small capacitances and resistors at various portions, they will be omitted for the sake of brevity.

Generally, the inductance (L) is defined as a proportionality coefficient of the current (I) and magnetic flux (φ) accumulated in a space as expressed by (Equation 2).

$$L = \phi/I \quad \text{(Equation 2)}$$

Therefore, the larger the space where the magnetic flux exists, the larger inductance (L) is, and thus the power noise of (Equation 1) becomes large. To compare the inductance of FIG. 19A to the actual semiconductor device of FIG. 17, almost all of the current in the small space from the circuit to the capacitor 42a having a low impedance is closed (current loop 200) through the inductances L01, L02 crossing the wiring layer 60 in the semiconductor chip 20 and the electrode 51. On the contrary, a space of a loop 204 where a current flows from the electrode 52 in the package 10 to the electrode 54 on the printed circuit board 1 is far larger, and thus its inductance is large. And the facts have a relation as shown by (Equation 3).

$$L01 \sim L02 < L \sim L2 < L7 \sim L8 \quad \text{(Equation 3)}$$

Here, the symbol "~" is used to denote "comparable with". L01 and L02 denote wiring inductances in the semiconductor chip 20, L1 and L2 denote inductances of the package 10, and L7 and L8 denote inductances to the large-capacitance capacitor (C04) of the printed circuit board 1. And, capacitances of the respective parts generally have a magnitude relation of (Equation 4).

$$C01 < C02 < C04 \quad \text{(Equation 4)}$$

Here, the on-chip capacitance C01 is a capacitance component of the semiconductor chip 20. C02 denotes a capacitance of the capacitor 42a, and C04 denotes a capacitance of the capacitor 49 mounted on the printed circuit board 1.

Note that, resistance components of the capacitors 42a, 49, the semiconductor chip 20, and the package 10 are all made of metals and thus very small. Therefore, different from the relation of inductances, there is no specific magnitude relation. That is, resistance components differ in every system using the semiconductor device.

Here, the most effective way to reduce noise is to mount the capacitance C01 having a large capacitance to the semiconductor chip 20. However, the price of the semiconductor chip is proportional to the chip area, and thus the large C01 cannot be mounted to lower cost.

From the magnitude relation of inductances (Equation 3) and the magnitude relation of capacitances (Equation 4), the capacitance C04 forming the loop 204 of the large-capacitance capacitor 49 mounted to the printed circuit board 1 cannot suppress variations of high-frequency current which are generated by the current source (I1) of the semiconductor chip 20. This is because the inductances (L7, L8 and L1, L2) between the capacitance C04 and the current source (I1) are large, and because a resonance frequency to the current source (i1) is low and thus supply of charge cannot be made enough. Further, while the on-chip capacitance C01 and the capacitance C02 of the capacitor 42a can comply with the variations of high-frequency current since their inductances L01, L02 are small, they cannot suppress power noise of low frequencies due to the insufficient charge.

Next, a limitation in the capacitance C02 of the capacitor 42a will be taken in consideration. Since the capacitor 42a generally mount a plurality of insulating layers of a high-dielectric-constant dielectric, it has a height to some extent. In other words, since the capacitor is formed by stacking a high-dielectric-constant dielectric, the height of the capacitor and a capacitance value (C02) of the capacitor have a subsequently proportional relationship. To suppress power noise, a large capacitance as the board capacitance C04 is necessary, but as seen from FIG. 17, the height after mounting the capacitor 42a should be lower than a height of the melted C4 solder ball 30 plus an allowance upon mounting the semiconductor chip 20 to the package 10. While the semiconductor chip 20 and the package 10 have different heat expansion coefficients as they are made of different materials, there will occur warpage to them due to the difference. And, the allowance means that a height of the capacitor 42a having a capacitance of C02 should have a margin more than the warpage of the package 10. For example, in the case of a bump pitch of 0.2 mm pitch, the C4 solder ball is about 0.07 mm after melted, and the height of the capacitor is required to be suppressed to about 0.05 mm. In other words, the capacitance of the capacitor is rate-controlled by the height of the C4 solder ball 30 after melted. A second problem is that the capacitor cannot be made large due to the limit of height.

And, the semiconductor device of the Prior Art 2 is an example where a decoupling capacitor 42b is mounted on the same layer of the solder ball 80 of the package 10. The decoupling capacitor 42b is mounted on the same surface of the solder ball 80, the surface is a back surface of the package 10. Therefore, the limit of height of the decoupling capacitor 42b is made by adding a margin to the height of the solder ball 80 after melted, and thus the height of the capacitor 42b can be high by the amount of the solar ball 80 larger than prior part 1, thereby making the capacitance large. For example, the solder ball of 1.0 mm pitch becomes 0.5 mm after melted, and the height of the capacitor is allowed to be 0.4 mm even the warpage of the board 0.1 mm is taken into account. Therefore, Prior Art 2 is capable of making a larger capacitance than Prior Art 1.

However, there is a problem that the parasitic inductance component from the solder ball 80 of the package 10 to the semiconductor chip 20 is increased than that of Prior Art 1. Now, in the system where the inductance (L) and the capacitance (C) are connected, the resonance frequency (ω0) has a relation as follows.

$$\text{Resonance frequency[radian]}(\omega 0) = 1/\sqrt{(L \cdot C)} \quad \text{(Equation 5)}$$

$$\text{Time-delay[second]} Td = \sqrt{(L \cdot C)} = 1/\omega 0 \quad \text{(Equation 6)}$$

Here, L denotes the inductance of the circuit, C denotes the capacitance of the circuit, and a time-delay of Td=(1/ω0) which is an inverse number of the resonance frequency occurs in the step response of LCR circuit as it has been known from the circuit theory. In other words, if an inductance (L) is parasitic on the power distribution system having a capacitance (C), it takes a time of Td to supply charge to compensate the current fluctuation along with the operation of transistor, and the time Td gets longer proportionally to a square root of the inductance (L).

In FIG. 19B, the decoupling capacitor 42b is mounted to the package 10, and thus parasitic inductances L1, L2, L3, L4, ESL03 will be parasitic from the electrode of the semiconductor chip 20 to the capacitance C03 of the capacitor 42b. This works to block the charge supply of the capacitor 42b.

And, there is another problem similar to Prior Art 1 that the number of solder balls 80 for signal or power/grounding mountable to the package 10 is decreased. To keep the number of signal balls and the number of power balls as same as before mounting the capacitor 42b, it is required to add solder balls corresponding to the area where the capacitor is mounted. This poses increase of the package area and increase of mounting area of the printed circuit board. That is, both the package and board are led to increase in cost.

As a third problem, the position to mount the capacitor is limited to lower noise of a signal transceiving interface block. Large scaled LSIs generally have a plurality of functional blocks, and they are signal-connected to the external each other when needed. In some cases a required power supply differs every block, and the circuit wiring is made so that different voltages are supplied respectively. For example, while the core voltage is often 1.0 V, in the case of a configuration by 90 nm CMOS circuits, to transmit and receive external signals of 3.3 V, application of 3.3 V is required. In this case, 1.0 V and 3.3 V are supplied to the same chip. Similarly, other than the different-kind power sources for different-kind interfaces, a power supply for analog circuit for generating clock of a phase-locked loop (PLL) and a delayed locked loop (DLL) and a power supply for a circuit handling faint signals such as radio signals are often made the power supply separated from other digital circuits in an area, even with a same voltage.

In the case of Prior Art 1 where the capacitor 42a is mounted to a same circuit-forming surface of the semiconductor chip 20, and further, the capacitor 42a is mounted to an edge of the semiconductor chip 20, it is impossible to form an electrode for signal to be connected to the external and to mount the solder balls to the position at this portion. Particularly, to a block at an edge of the semiconductor chip, an input/output circuit block for transceiving external signals is often provided for the ease of drawing out the signal wiring of the package, which is an advantage of the position. Therefore, arranging the capacitor for supplying charge needed by the circuit block of at an edge of the semiconductor chip 20 and arranging the solder ball for signals are a trade-off.

The more the number of signal terminals of the semiconductor chip 20 be, the wider the area not capable of mounting the capacitor be, therefore the capacitor needed to the input/output block should be mounted farther, and thus the inductance is large. This means that the capacitor does not take part in the reduction of noise much. As the third problem, there is a limit that the capacitor for low noise in the block of the signal-transceiving interface cannot be arranged on a chip edge.

As a fourth problem, a resonance is generated due to a small resistance component. As shown in FIGS. 19A and 19B, in both Prior Art 1 and Prior Art 2, the inductance (L), capacitance (C), and resistance component (R) form the current loops 200, 203 in the power-supply system for power-supply to the semiconductor chip 20, and they configure a resonance system of LCR as known from the circuit theory, so that a resonance of the resonance frequency of (Equation 5) is generated. The magnitude of the resonance is expressed by a factor of quality (Q factor), as shown by (Equation 7).

$$Q = (\omega 0 \cdot L)/R \quad \text{(Equation 7)}$$

Here, $\omega 0$ is the resonance frequency of (Equation 6), and "L" in FIG. 19A denotes the inductance of the LCR circuit, which is an inductance (ESL02+L01+L02) of the current loop 200 from the current source (I1) and the capacitance (C01) of the semiconductor chip 20 to the capacitance (C02) of the external capacitor 42a, and "R" denotes the resistance component including ESR02 of the current loop. And, although not apparently shown in (Equation 7), "C" included in $\omega 0$ is a sum of the on-chip capacitance (C01) of the semiconductor chip 20 and the capacitance (C02) of the external capacitor 42a (C01+C01). In FIG. 19B, the sum of inductances is (L01+L1+L3+ESL03+L4+L2+L02), and the capacitance is (C01+C03). Since the respective parts are metal wirings, the resistance of the loop is small and includes ESR03.

It has been known that, when the resistance (R) is smaller than a product of $\omega 0$ and L, that is, the Q of (Equation 7) is equal to or larger than 1, a larger resonance voltage than the applied voltage to the semiconductor chip 20 is generated. While the Q factor of the current loop of the power distribution system is required to be small in order to stably operate the semiconductor chip 20, since the wiring forming the current loop of Prior Art 1 and Prior Art 2 is made of a metal such as copper and aluminum and the power wiring is thick, R is small. Therefore, Q factor gets larger, and there is a problem that the power-supply voltage at the resonance frequency generates large noise. In other words, the problem is that the applied voltage to the semiconductor chip 20 is fluctuated at the resonance frequency by the LCR loop.

Accordingly, an object of the present invention is to solve the above first to fourth problems, and provide a semiconductor chip and a technique of semiconductor device mounting the semiconductor chip capable of: making a capacitance of a capacitor large without reducing the number of signal bumps or power bumps and the number of C4 solder balls of the semiconductor chip; and achieving a stable power supply with suppressing fluctuation of power supply at a resonance frequency without limiting a position to mount a capacitor for lowering noise of a signal-transceiving interface block.

The above and other objects and novel characteristics of the present invention will be apparent from the description of this specification and the accompanying drawings.

The typical ones of the inventions disclosed in this application will be briefly described as follows.

The present invention provides a via hole to a semiconductor chip and provides an electrode for power connected to the via hole to a back surface of the semiconductor chip, and mounts a capacitor to the electrode of the back surface. And, a material having a high resistance is used for a material of the via hole, thereby increasing the resistance and lowering Q factor.

The effects obtained by typical aspects of the present invention will be briefly described below.

(1) The capacitor is mounted on a back surface of the chip, thereby solving the problem of largely reducing the number of signal bumps or power bumps connectable to a package by mounting the capacitor to the package, or the problem of largely reducing the number of C4 solder balls due to mounting the capacitor on a circuit surface of the chip.

(2) As to a limit of a height of the capacitor, it is not limited to a height of the C4 solder ball and solder ball. Therefore, the second problem of incapability of making the capacitor have a larger capacitance due to the height limitation can be solved.

(3) Since the large-capacitance capacitor is mounted on the back surface of the semiconductor chip, no barrier is given to the formation of circuit of the chip surface. Therefore, the third problem of the limit in a position to mount the capacitor due to the noise lowering of the signal transceiving interface block can be solved.

(4) The fourth problem of a fluctuation in power supply due to large Q factor of the current loop can be solved by making the resistance component by configuring the via hole in the semiconductor chip by a material having a high resistance and lowering the Q factor of the resonance of the current loop. In this manner, even at the resonance frequency, the fluctuation in power supply can be suppressed, thereby achieving a stable power supply.

BRIEF DESCRIPTIONS OF THE DRAWINGS

FIG. 3 is a birds-eye view showing the semiconductor device according to the first embodiment;

FIG. 8A is a bottom view showing a semiconductor chip mounting a resistor and a capacitor after mounting a capacitor in a semiconductor device according to a third embodiment of the present invention;

FIG. 8B is an equivalent circuit diagram showing a state where the semiconductor device according to the third embodiment of the present invention is mounted to a printed circuit board;

DESCRIPTIONS OF THE PREFERRED EMBODIMENTS

Figure 1:
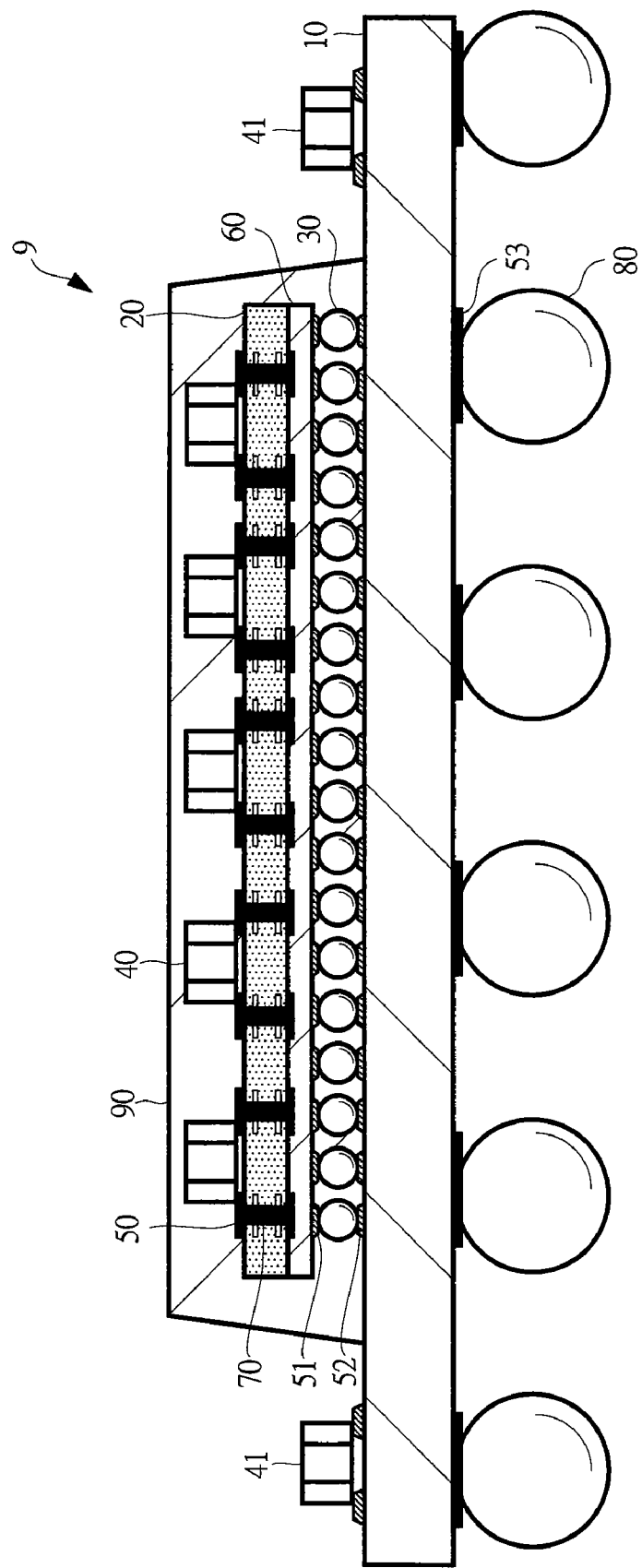
FIG. 1 is a cross-sectional view showing a semiconductor device according to a first embodiment of the present invention.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

A first embodiment of the present invention will be described with reference to FIG. 1 to FIG. 6.

Described in the present embodiment is about power noise that influences a semiconductor chip in a semiconductor device. Although signals and signal wirings are not described in the drawings for the sake of easy view, they are included in the actual products, and they will be described as needed herein after.

And, in the following description, the semiconductor chip may be described as a chip, the decoupling capacitor may be capacitor or a chip capacitor, and a semiconductor package may be described as a package, a semiconductor interposer, or an interposer. Moreover, an electrode may be described as a pad, a C4 solder ball may be described as a solder ball or a bump.

FIG. 1 shows a cross-sectional view of the semiconductor device according to the present embodiment. A circuit function for information processing is mounted to a semiconductor device (LSI) 9. The semiconductor device mainly comprises: a semiconductor chip 20; a semiconductor package (semiconductor interposer) 10; a C4 solder ball 30 for connections; a solder ball 80; and large-capacitance decoupling capacitors 40, 41. An electrode 52 of the chip side and an electrode 53 of a board side are formed on the package 10, and they respectively have a wiring between respective signal electrodes. Similarly, a power supply is wired between respective power electrodes.

The electrode 53 of the board side is connected to a printed circuit board via the solder ball 80. The electrode 52 of the chip side is connected to the semiconductor chip 20 via the C4 solder ball 30. A circuit for information processing is formed to the semiconductor chip 20, and the circuit is formed by a multilayered wiring layer 60. An electrode (pad) 51 of the C4 solder ball 30 is formed on a surface of the wiring layer 60.

And, a via hole 70 for connecting the wiring layer and a back surface of the semiconductor chip 20 is formed in the semiconductor chip 20. An electrode 50 for the capacitance connected to the via hole 70 is formed on the back surface of the semiconductor chip 20, and the large-capacitance capacitor 40 is mounted between the electrodes 50.

While the capacitor 41 is mounted also to the semiconductor package 10 in the present embodiment, to mount it or not depends on the actual application. In other words, when the capacitance is not sufficient with the capacitor 40 mounted on the back surface of the chip, the capacitor 41 can be additionally mounted to the package. And similarly, while a mold 90 is applied by a resin material for a purpose of improving connection reliability of the semiconductor chip 20 and the capacitor 40, to apply it or not depends on the actual application.

The capacitor 40 has a high-dielectric insulating layer and mounted on the back surface of the semiconductor chip 20. Thus, there is no limit in a height of the solder ball, which has been a problem in the Prior Art. Therefore, even a capacitor having a large height can be mounted, thereby mounting a large-capacitance capacitor, and mounting the capacitor close to the wiring layer 60 of the semiconductor chip 20 by a distance about the via hole 70. Note that, there is a method of forming the via hole 70 in the semiconductor chip 20 as described in Japanese Patent Application Laid-Open Publication No. 2005-197568.

Figure 2:
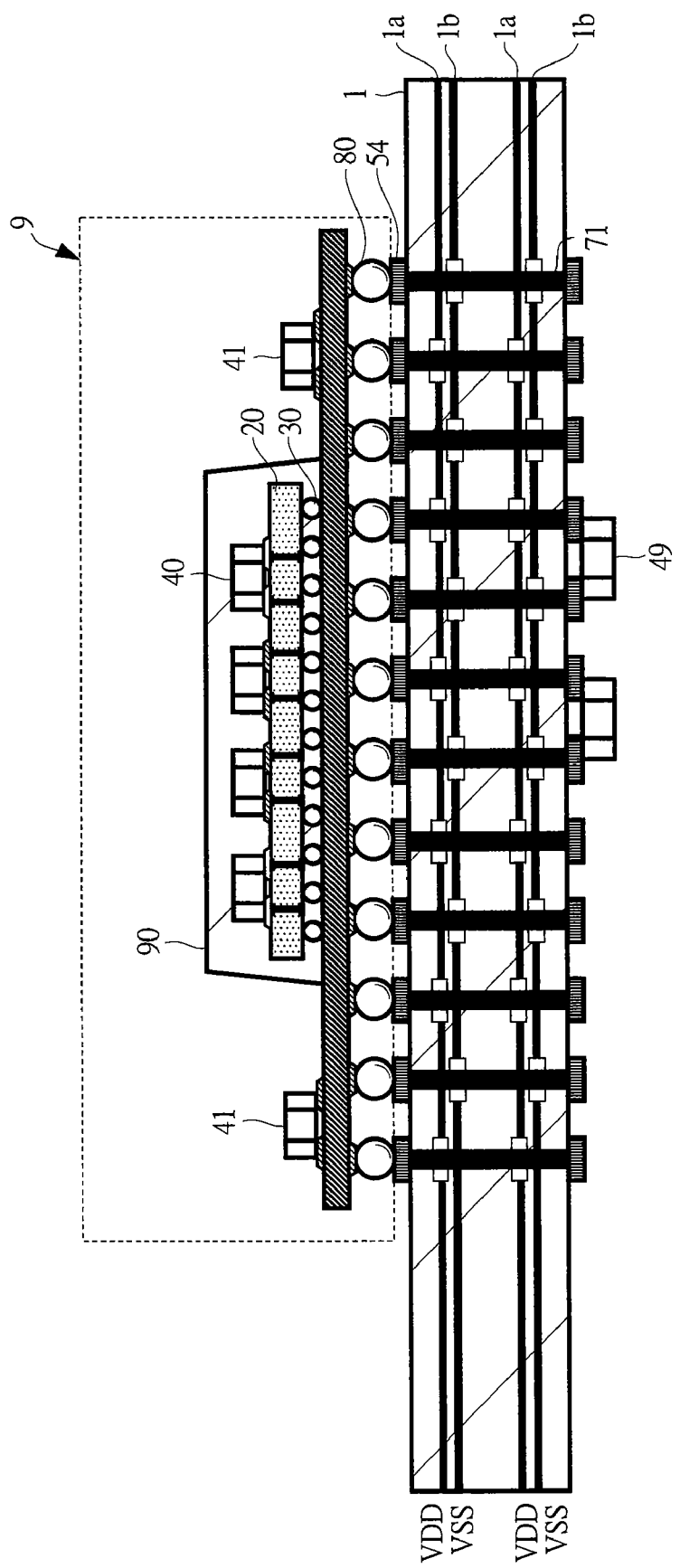
FIG. 2 is across-sectional view showing a state where the semiconductor device according to the first embodiment of the present invention is mounted on a printed circuit board.

FIG. 2 shows a cross-sectional view showing a state where the semiconductor device 9 of FIG. 1 is mounted on the printed circuit board. The semiconductor device 9 enclosed by the dotted line is the same with that in FIG. 9, and the semiconductor device 9 is connected to the printed circuit board 1 having the multilayered power layer electrically and mechanically. 1a, 1b are a power layer (VDD) and a ground layer (GND) provided in the printed circuit board 1, respectively. The power layer 1a and the ground layer 1b are connected to the solder ball 80 of the semiconductor device 9 by a via hole 71 via the electrode 54 on an upper surface of the printed circuit board 1. In this manner, a voltage is applied to the semiconductor device 9 from a power circuit not shown in the diagram of the printed circuit board 1.

And, although it depends on the application, a capacitor 49 is mounted also to the printed circuit board 1, and it is mounted to the back surface in FIG. 2. Or, a large-capacitance capacitor such as an aluminum electrolytic capacitor and a tantalum capacitor not shown may be mounted to the board.

FIG. 3 shows a bird-view of FIG. 2. The circuit surface of the semiconductor chip 20 is mounted on the package 10 by the C4 solder ball 30 facing downwards, and the capacitor 40 is mounted on the back surface (upper surface) of the semiconductor chip opposite to the circuit surface, and they are sealed by the mold 90. The capacitor 41 is mounted on the package 10. The semiconductor device 9 has the solder ball 80, and this is connected to the electrode 54 formed on the printed circuit board 1 as melted.

Other than the capacitor 49, other functional parts, a power circuit, passive parts such as a filter not shown here are mounted to the printed circuit board 1, thereby configuring a system.

Figure 4A:
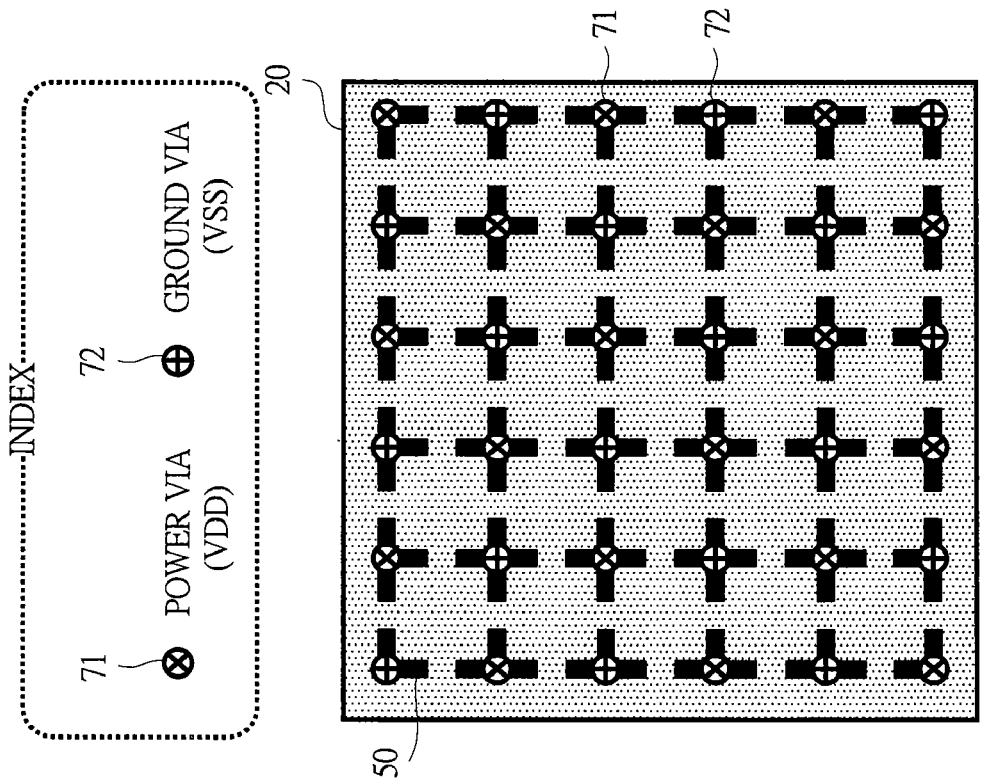
FIG. 4A is a top view showing a semiconductor chip in the semiconductor device according to the first embodiment.
Figure 4B:
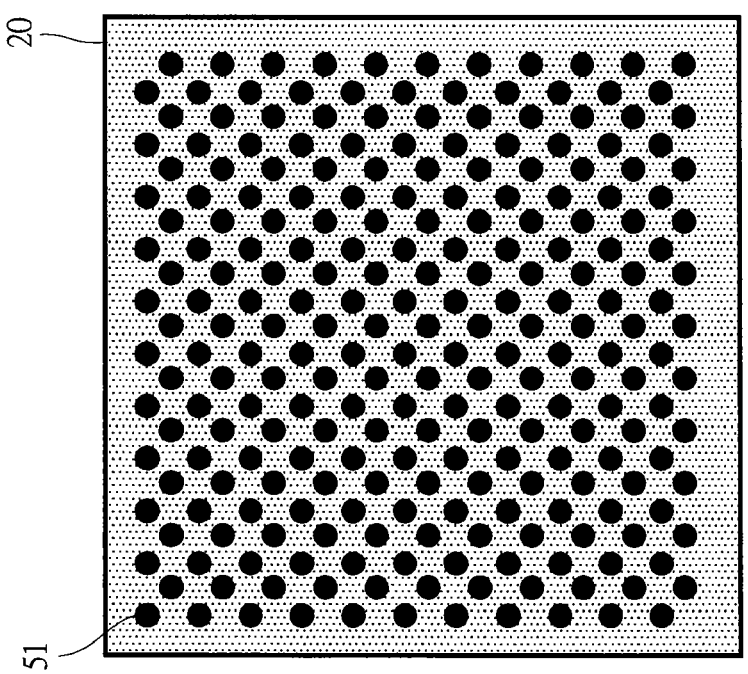
FIG. 4B is a bottom view showing the semiconductor chip in the semiconductor device according to the first embodiment of the present invention.

FIGS. 4A and 4B show configurations of the electrodes of the semiconductor chip 20 to be embedded in the semiconductor device 9. The semiconductor chip 20 in FIG. 4A shows an arrangement of electrodes at the wiring layer side (surface) of the circuit, and the electrodes 51 for the C4 solder ball are formed in a reticular pattern to an uppermost layer of the wiring layer 60 of the circuit. Signal transfer and voltage application is made to the circuit of the semiconductor chip 20 via the electrode 51.

The electrodes 50 on the back surface of the semiconductor chip 20 are formed in the configuration of FIG. 4B. The electrode 50 is connected to the via hole 70 formed in the semiconductor chip 20. An index is shown in FIG. 4B for the sake of easy understanding. Specifically, the via hole 71 for the power (VDD) is denoted by ⓧ (a circle including an x-mark inside), and a via hole 72 for grounding (GND) is denoted by ⊕ (a circle including a plus-mark inside). Other than these, a via hole for signal may be provided.

The via holes 71, 72 of the back surface layer of the semiconductor chip 20 are connected to the electrodes 50 for connecting the capacitor 40. The arrangement of the electrodes 50 is made so that different voltages like positive (+) and negative (−) ones are applied to the capacitor 40. Here, in the case where the power voltage applied to the semiconductor chip 20 is a pair of VDD and VSS, VDD and VSS are alternatively arranged to the electrodes 50, and the via hole 71 and the via hole 72 to be connected to VDD and VSS are also arranged alternatively. And, since the via holes 71, 72 are connected to a plurality of electrodes 50, a large number of decoupling capacitors 40 can be mounted to the chip 20 with a small number of via holes. Further, the electrodes 50 of the adjacent decoupling capacitors 40 are alternatively arranged in lines, thereby the current to flow through the adjacent capacitors 40 will be flow in antiparallel, thereby obtaining an effect of reducing inductance of the current paths including the adjacent capacitors. Moreover, a plurality of via holes 70 are prepared for one electrode 50, thereby reducing inductance.

Figure 5:
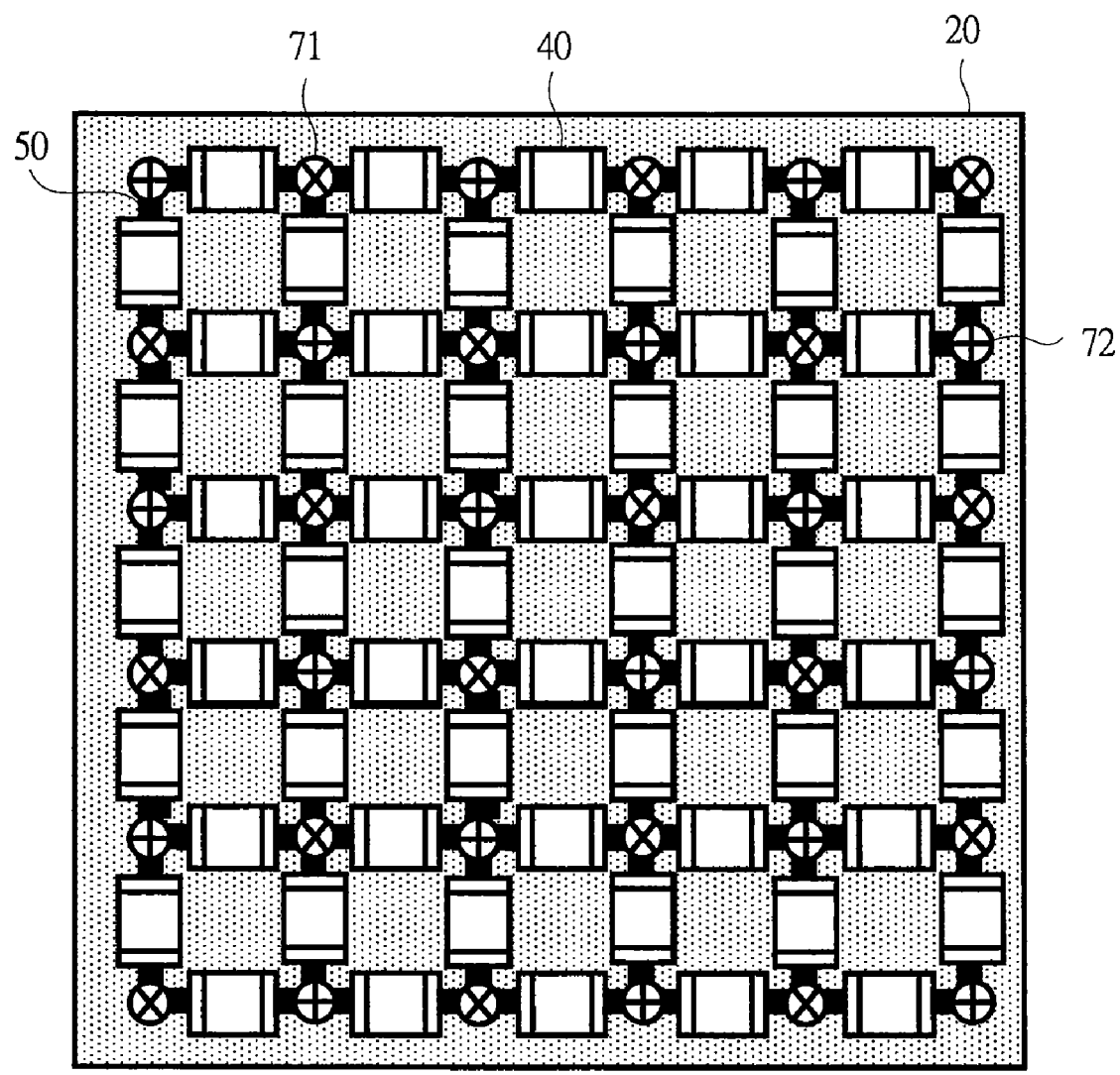
FIG. 5 is a bottom view showing a state where a capacitor is mounted on a back surface of the semiconductor chip in the semiconductor device according to the first embodiment of the present invention.

FIG. 5 shows a bottom view showing a state where the capacitor 40 is mounted on the back surface of the semiconductor chip 20 in FIGS. 4A and 4B. The capacitor 40 of FIG. 4 has two terminals, and respective terminals are connected to the electrodes that are connected to different kinds of voltages via the via holes 71, 72, respectively, similarly to FIG. 4B. While FIG. 5 is a diagram where the capacitor 40 are arranged on the entire surface, the effect given by the capacitor 40 is the same whichever the capacitor 40 is mounted such that the capacitance required to the semiconductor chip 20 is small or large.

As described above, the capacitor 40 is mounted on the back surface of the semiconductor chip 20, thereby mounting the capacitor 40 very close to the chip 20 without increasing the area of the semiconductor chip 20 itself. Therefore, the first problem that the number of the signal bumps or the power bumps connectable to the package is largely reduced by mounting the capacitor to the package, or that the number of the C4 solder balls is largely reduced by mounting the capacitor on the chip circuit surface can be solved.

Further, according to the present embodiment, the limit in height of the capacitor 40 is not limited by the heights of the C4 solder ball and the solder ball. Therefore, the second problem that the capacitor is unable to be larger due to the limit in height can be solved.

Figure 6:
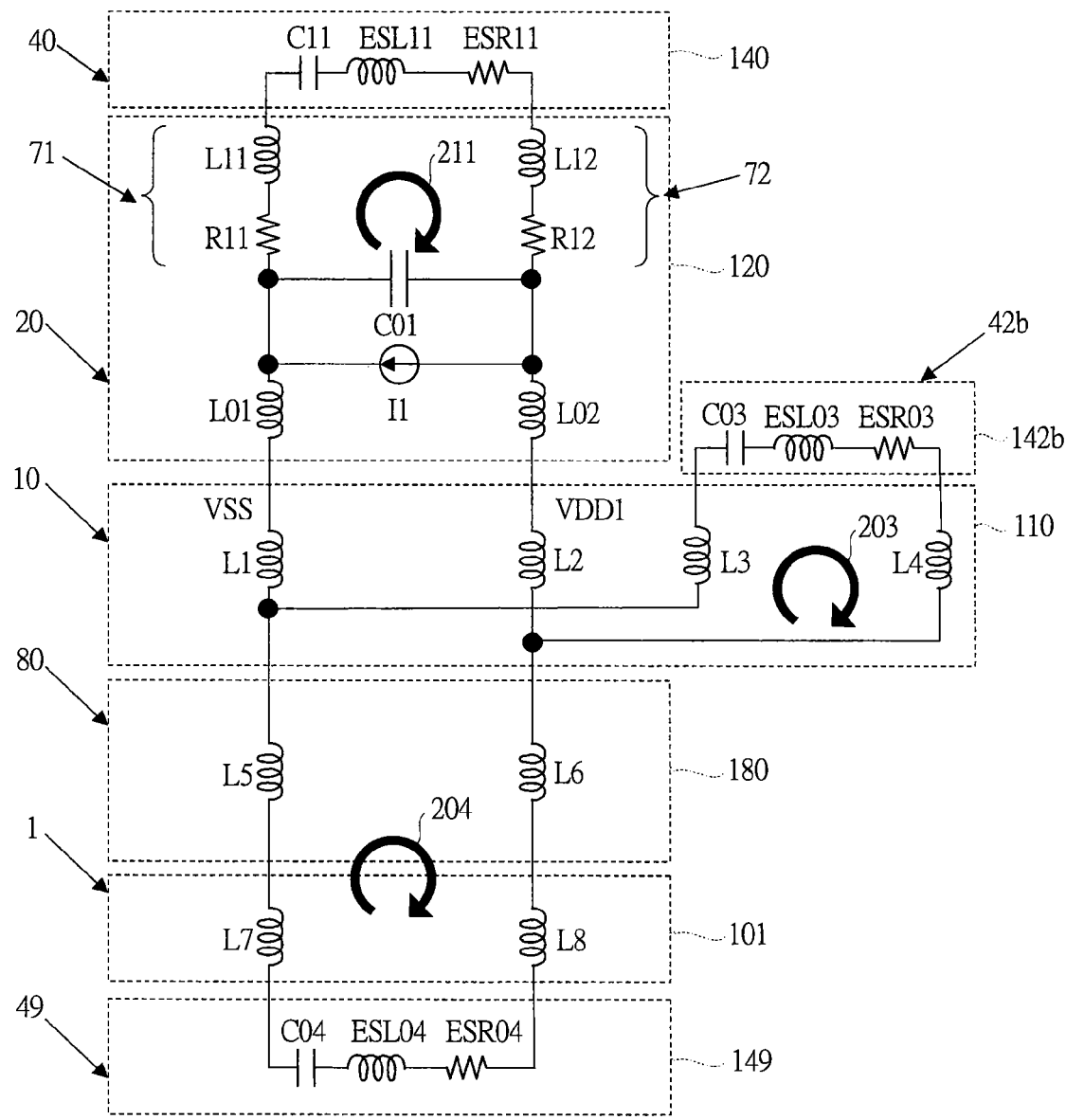
FIG. 6 is an equivalent circuit diagram showing a state where the semiconductor device according to the first embodiment of the present invention is mounted on the printed circuit board.

Next, FIG. 6 shows an equivalent circuit of the first embodiment, and electrical effect thereof will be described. An equivalent circuit of the semiconductor chip 20 is shown by 120 in FIG. 6. That is, the on-chip capacitance (C01) which the semiconductor chip 20 has and the current source (I1) connected to C01, and the operative transistor in the semiconductor chip 20 generates the AC current, and the static transistor works as capacitance. Here, the capacitance denotes a capacitance component to distinguish from a capacitor. The capacitor 40 includes a resistance (ESR11) and an inductance (ESL11) inside. Only components contributing to the effect are shown as the equivalent circuit.

The equivalent circuit 120 of the semiconductor chip 20 is connected to the large-capacitance capacitor 49 (C04) mounted on the printed circuit board 1 via an equivalent circuit 110 of the package 10, an equivalent circuit 180 of the solder ball 80, and an equivalent circuit 101 of the printed circuit board 1. Here, since the power noise is posed by induced noise induced by the inductance, respective equivalent circuits are shown by inductances. Such as, the equivalent circuit of the package 10 is shown by L1 and L2, the equivalent circuit of the solder ball 80 is shown by L5 and L6, and the equivalent circuit of the printed circuit board is shown by L7 and L8.

And, the equivalent circuit of the capacitor 40 mounted on the back surface of the semiconductor chip 20 is denoted by C11, and an equivalent circuit of the via holes 71, 72 in the semiconductor chip 20 is denoted by L11, L12. The inductances L11 and L12 are proportional coefficient of the current (I) to flow through them and the magnetic flux (φ) induced by the current, as shown by (Equation 2).

First, effects of the present invention of those of Prior Art 1 will be compared. The current loop 200 of FIG. 19A has the capacitor 42a just above the circuit wiring layer 60, and thus the distance from the circuit of the semiconductor chip 20 to the capacitor 42a is about the thickness of the electrode 51, that is, several μm. As to the parasitic inductance (ESL02) which the capacitor 42a has, the inductances L01, L02 between the circuit and the capacitor 42a are significantly smaller than ESL02. If the size of the capacitor is, for example, 1.0×0.5 mm² and the distance the current flows is 1 mm, the distance from the circuit of the chip 20 to the capacitor 42a is several μm. Thus, the inductance (ESL02) is larger than the inductances (L01, L02) by two digits.

According to the present embodiment (FIG. 6), the inductance of a current loop 211 is slightly larger than Prior Art 1. This is because the inductances L11, L12 of the via hole 70 that has a thickness about the thickness of the semiconductor chip 20 are larger than L01, L02 of Prior Art 1. When the sizes of the capacitor 42a and the capacitor 40 are same, their parasitic inductances ESL02 of FIG. 19A and ESL11 of FIG. 6 are same. Therefore, as previously described, L01, L02 of Prior Art 1 are about 1/100 time smaller than ESL02, and L11, L12 of the present embodiment are about 1/10 time smaller than ESL02, and thus there is substantially no influence from the increase of L11, L12. Specifically, the current loops 200 and 211 have the capacitor 42a and capacitor 40, and the parasitic inductance (ESL02) and the inductance (ESL11) which are same, and thus the magnitude of capacitance of the capacitors determine the electrical effects. The present embodiment is capable of increasing the capacitance C11 without limit in height, thereby having an effect of reducing noise in this point than Prior Art 1.

Figure 18:
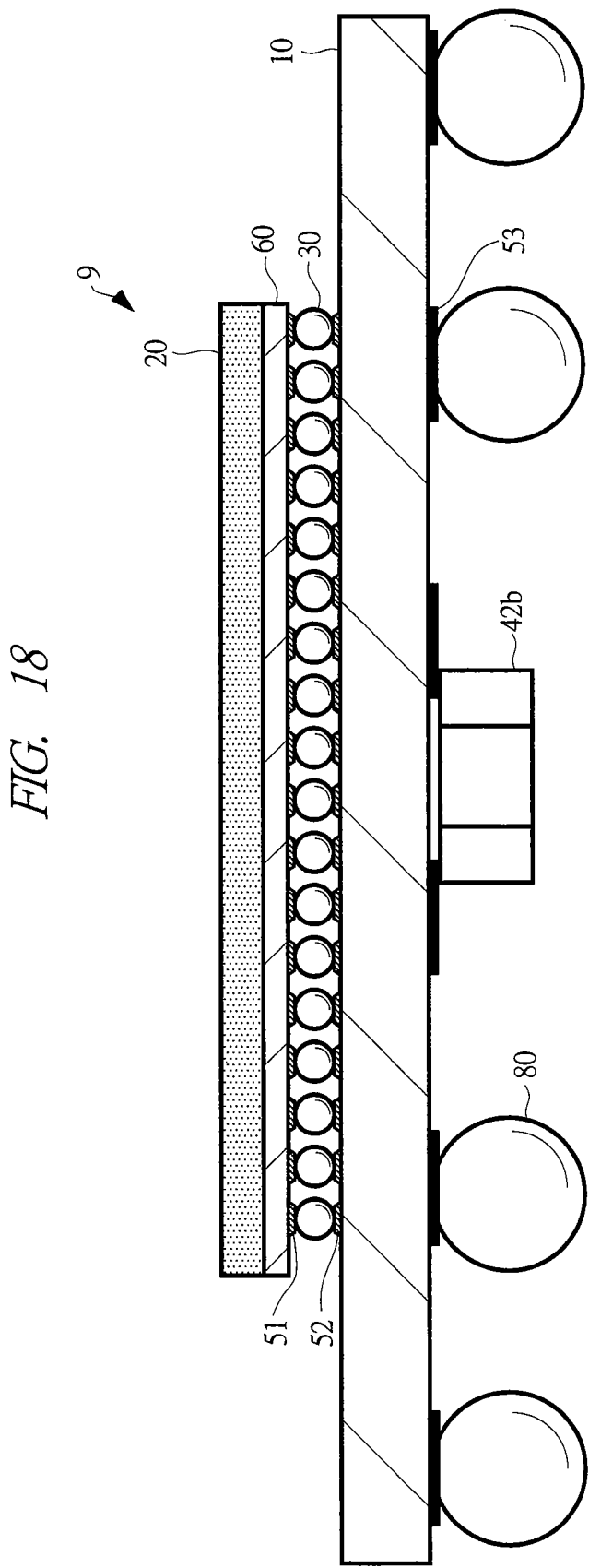
FIG. 18 is a cross-sectional view showing a semiconductor device according to Prior Art 2 with respect to the present invention.
Figure 19B:
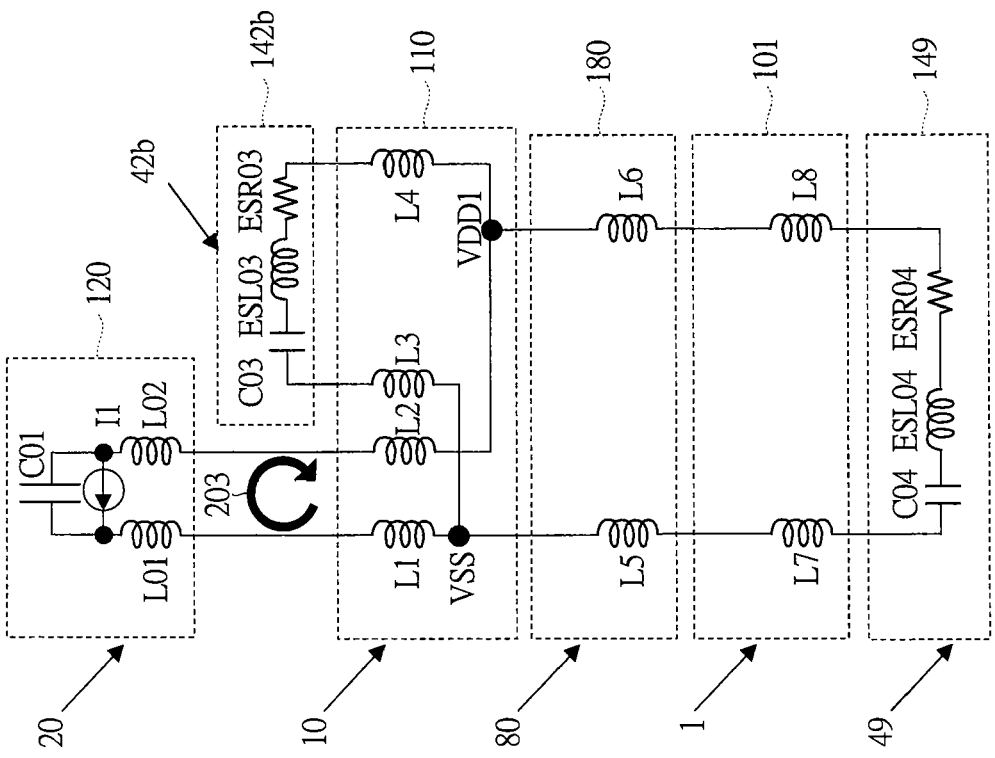
FIG. 19B is an equivalent circuit diagram showing a state where the semiconductor device of Prior Art 2 is mounted to a printed circuit board.
Figure 19A:
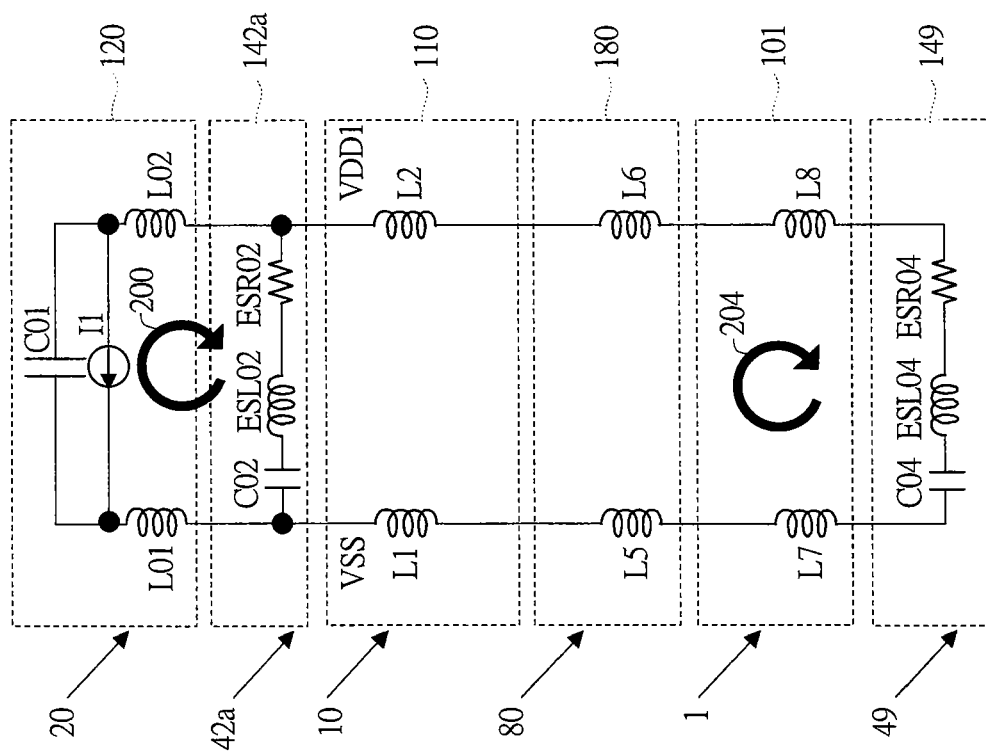
FIG. 19A is an equivalent circuit diagram showing a state where the semiconductor device of Prior Art 1 is mounted to a printed circuit board.

Next, as comparing the present embodiment with the case of the on-package capacitor 42b of Prior Art 2 (FIG. 18), the current loop 211 of the present embodiment (FIG. 6) and the current loop 203 of FIG. 19B are largely differ in inductance. That is, the board has a thick thickness on the path to the capacitor 42b in Prior Art 2, and a thickness of the package of Prior Art 2 is about 0.1 to 0.2 mm in view of ensuring structural strength, and thus the height is smaller by one digit. Therefore, the inductances L11, L12 of FIG. 6 is smaller than the inductances L3, L4 of FIG. 19B by one digit. Since the size is about 1 mm, the inductances L3, L4 are almost same with a parasitic inductance ESL03, and the present embodiment has an inductance of about 1/10 time of the inductance ESL03. Therefore, the effect of the present embodiment to Prior Art 2 is obtained by the smallness of the inductances L11, L12 and the capability of increasing the capacitance of the capacitor 40, and thus it is found that the present embodiment has larger effects of noise reduction.

Further, as a secondarily effect, the present embodiment has an effect of resistance to leakage of high-frequency noise from the semiconductor chip 20 to the outside of the package 10 as compared to Prior Art 2, as it can be found from the delay time Td of (Equation 6). The reason is such that the charge to compensate the current fluctuation along with the operation of the transistor in the semiconductor chip 20 is supplied to the transistor in a short period, and on the contrary, the large inductance (L01+L1+L3) to the on-package capacitor 42b or the inductances L7, L8 of the printed circuit board works as decoupling, that is, a separation from the external power distribution system at high-frequencies, thereby preventing high-frequency noise from leaking to the external. This is of key importance in a system having radio function. This is because the smaller the noise in radio frequency (RF), the higher the signal noise ratio (S/N) can be kept, thereby contributing to size reduction of antennas and power reduction of low-noise amplifiers (LNA). Therefore, the present embodiment is applicable to radio systems.

Moreover, the present embodiment can increase the resistance (R11, R12) values of the current loop 211 in FIG. 6 and decrease the Q factor by changing the material of the via hole 70 in the semiconductor chip 20 to a high-resistance material and reducing the number of the via holes 70 to half. More specifically, by increasing the component of R in the Q factor at the resonance frequency, that is, Q=(ω0/L)/R, attenuation can be made even at the resonance frequency. Therefore, the fourth problem of large Q factor can be solved as suppressing the Q factor to small by controlling a ratio of inductance/resistance. Consequently, a ripple of noise at the resonance frequency can be suppressed.

Second Embodiment

A second embodiment of the present invention will be described with reference to FIG. 7.

The present embodiment is, similarly to the first embodiment, an example where the capacitor 40 is mounted on the back surface of the semiconductor chip 20. A difference from the first embodiment lies in that the applied voltage to the capacitor 40 is sectioned by the kinds of power supplies.

Figure 7A:
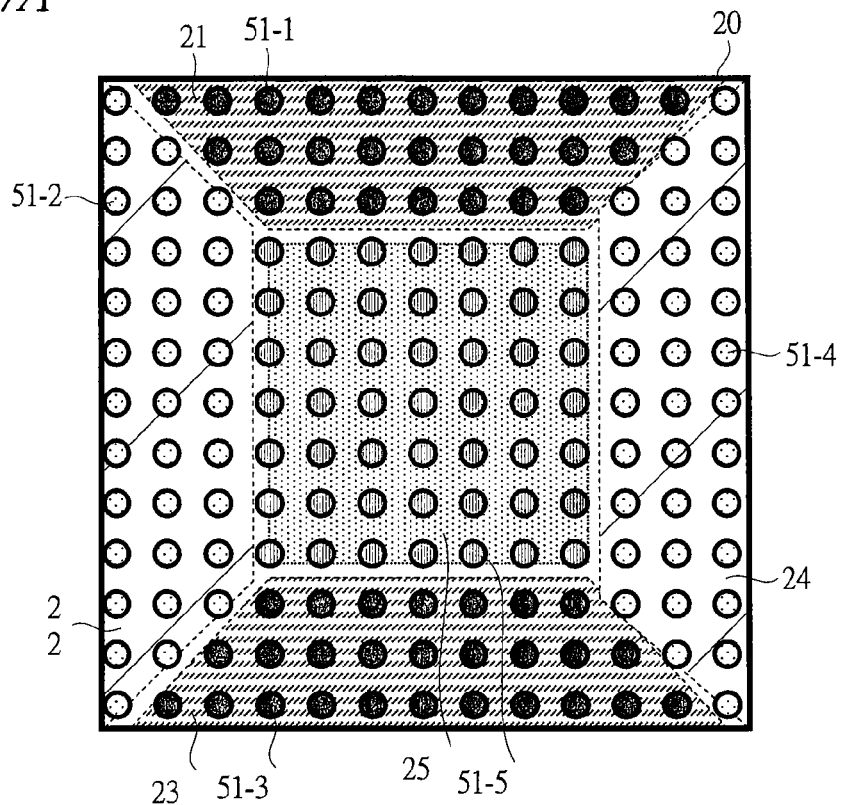
FIG. 7A is a top view showing a semiconductor chip having a plurality of blocks of various kinds of power supplies in a semiconductor device according to a second embodiment of the present invention.

FIG. 7A is a top view showing the wiring layer side (surface) of the semiconductor chip 20, and blocks (areas) of the circuits formed on the semiconductor chip 20 are denoted by 21 to 25. While there are five functional blocks to which different powers are supplied are described in FIG. 7A, the number may be larger or smaller.

Electrodes 51-1 to 51-5 for the C4 solder ball 30 are arranged in a reticular pattern on the upper surface of the semiconductor chip 20. The areas 21 to 25 are blocks having input/output interface circuit functions of different signals, and a signal and power are supplied to the upper surface of the circuit wiring side of the semiconductor chip 20 via the electrode 51-1 in the area 21. The electrode 51-2 to the area 22, the electrode 51-3 to the area 23, the electrode 51-4 to the area 24, and the electrode 51-5 to the area 25 are arranged similarly.

Figure 7B:
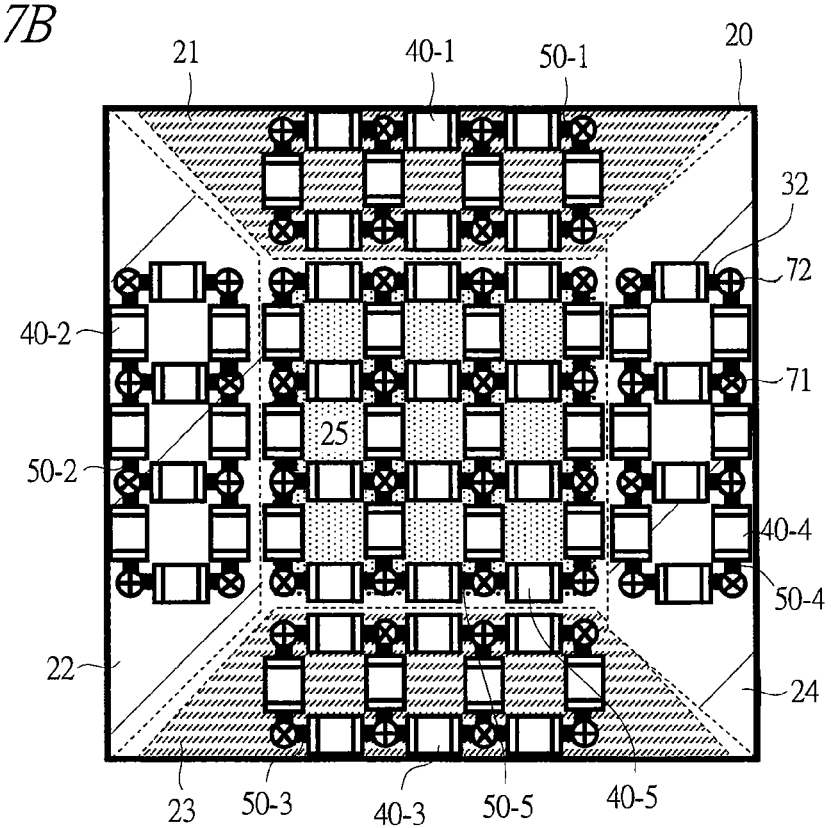
FIG. 7B is a bottom view showing the semiconductor chip having the plurality of blocks of various kinds of power supplies after mounting a capacitor in the semiconductor device according to a second embodiment of the present invention.

FIG. 7B is a bottom view showing the back surface of the semiconductor chip 20. An electrode 50-1 connected to the power wiring to supply power to the circuit of the wiring layer 60 of the semiconductor chip 20 via the via hole 70, and a capacitor 40-1 connected to the electrode 50-1 are arranged in the area 21. Similarly, electrodes 50-2 to 50-5 and capacitors 40-2 to 40-5 are arranged also to the areas 22 to 25.

The capacitor 40-1 is connected only to the power and ground of the functional blocks of signal input/output interface circuit arranged in the area 21 of FIG. 7A. Therefore, even when the electrodes 51-1 for signal input/output are arranged in a large number on the upper surface of the semiconductor chip 20, the capacitors 40-1 will not overlap spatially, and a plurality of capacitors 40-1 can be mounted on the back surface of the chip 20. Therefore, the third problem of the limitation in position to mount the capacitor for reducing noise in the signal transceiving interface block does not occur. Consequently, as well as mounting a sufficiently large capacitor, a required number of electrodes 51-1 can be provided to the area 21.

Similarly, since the areas 22, 23, 24 have the same configuration, the effect that there is no limitation to the position to mount the capacitor for reducing noise of the signal transceiving interface block occurs can be obtained.

Further, as to the capacitor 40-1, while the electrodes of the capacitors 40-2 to 40-5 mounted to areas 22 to 25 other than the area 21 where the capacitor 40-1 is mounted have different power voltages, the electrodes at ground side can be connected by a common wiring.

Moreover, even they have a same voltage, the voltage differs in the capacitor 40-1 and the capacitors in different kinds of areas. Therefore, propagations of noise between the areas can be eliminated. This is particularly-important for a circuit in an area for processing faint signals such as radio signals. In other words, this is because reception of faint signals is enabled with processing signals at high speed.

Third Embodiment

A third embodiment of the present invention will be described with reference to FIGS. 8A and 8B.

The present embodiment is, similarly to the second embodiment, an example where the capacitor is mounted on the back surface of the semiconductor chip 20 per area. In addition, this is an example where a resistor (R) 40-6 having an almost same size as the capacitor is additionally mounted on the back surface of the semiconductor chip 20 to configure a filter.

An area 26 in FIG. 8A is an analog circuit unit such as a PLL configured by the wiring layer 60 of the semiconductor chip 20. FIG. 8B shows an equivalent circuit 126 of the area 26. The power of the area 26 is connected to the power wiring in the wiring layer 60 by a via hole, and connected to an electrode 50-6 of the back surface of the semiconductor chip 20 by the via hole. And, the resistor (R) 40-6 and a capacitor (C) 40-7 are connected to the electrode 50-6, thereby configuring a low-pass filter (LPF). Although not shown, a capacitor is mounted also to the area 25. In this manner, also in the case where another functional block is provided in an area, an LPF can be configured without interposing the package and without using the C4 solder ball, so that the C4 solder ball can be used for other purposes. Further, as compared with the LPF provided to the printed circuit board, the parasitic inductance can be small, thereby reducing the number of configuration parts of the LPF as well as shifting the resonance frequency to high range. Therefore, the area for LPF on the printed circuit board can be eliminated.

It can be found in the equivalent circuit of FIG. 8B that the LPF is configured of the resistor 40-6 and the capacitor 40-7 via the inductances L11, L12 of the via hole 70 of the area 26 in the chip. Note that, the parasitic components (ESL, ESR) are omitted. By configuring in this manner, even in the case where the area 26 of the analog circuit is surrounded by the area 25 having large noise, as well as the power noise of the area 25 can be cut, the number of the respective balls of the solder balls of the package for connecting the C4 solder ball can be reduced, thereby reducing the chip area by that amount. Further, the LPF formed on the printed circuit board can be configured on the back surface of the chip, thereby reducing the area of the printed circuit board.

Fourth Embodiment

A fourth embodiment of the present invention will be described with reference to FIG. 9 to FIG. 11.

The present embodiment is a semiconductor device where a core logic power supply relating to signal processing of the semiconductor circuit in the semiconductor device 9 is performed by bonding wires via the back surface of the chip, and the C4 solder ball connecting the chip and package is used for transceiving signals and for a current path relating to a return current of the signals.

Figure 9:
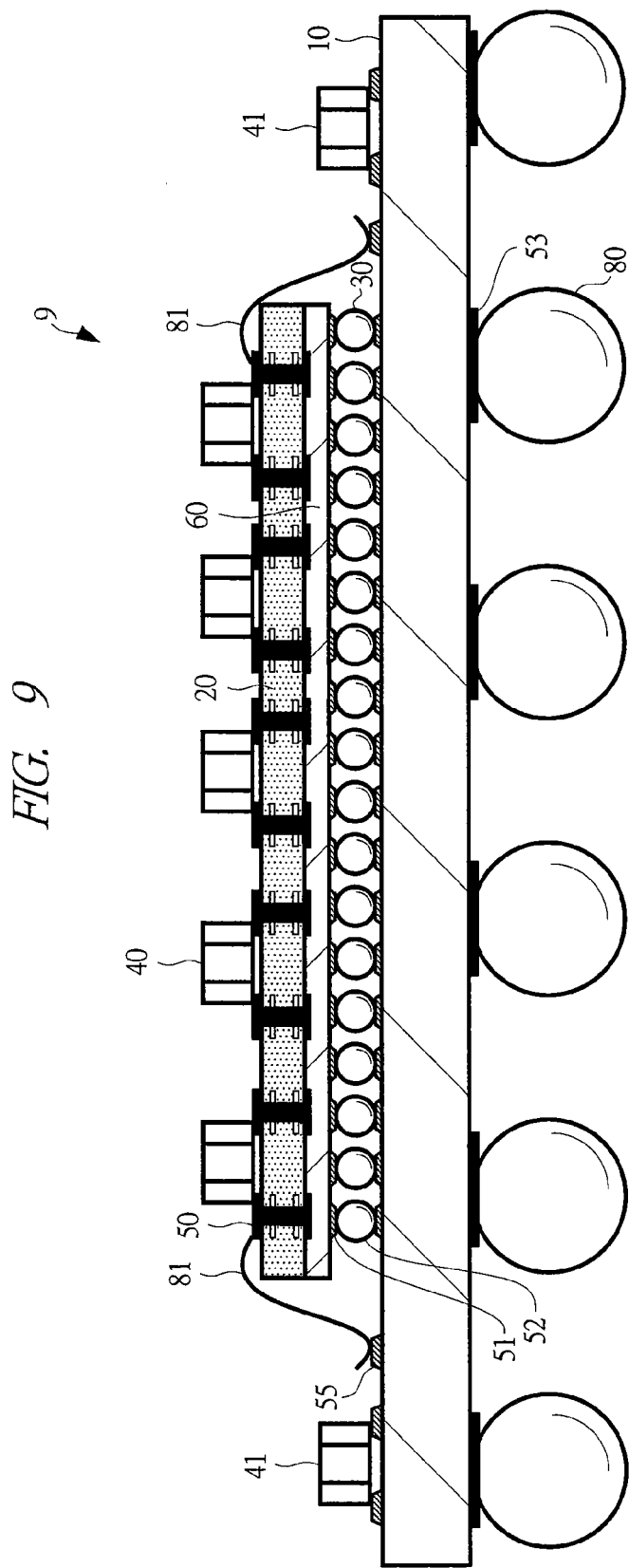
FIG. 9 is a cross-sectional view showing a semiconductor device according to a fourth embodiment of the present invention.

FIG. 9 shows a cross-sectional view showing the semiconductor device according to the present embodiment. 81 denotes the bonding wire. 55 denotes a bonding wire electrode provided at the semiconductor chip 20 side of the semiconductor package 10. The bonding wire 81 connects the power electrodes 55 of the package 10 and the electrode 50 provided on the back surface of the semiconductor chip 20.

More detailed descriptions will be given with reference to FIG. 10. FIG. 10 is a top view of FIG. 9. The capacitor 41 and the chip 20 are mounted to the package mounting the semiconductor chip 20. And, a power electrode (VDD) 55-1 and a power electrode 55-2 of different kinds of power supplies are provided so as to surround the chip 20 and respectively connected to the power electrodes 50-1, 50-2 on the chip 20 by the bonding wires 81, 82. The capacitor 40 is connected between the power electrodes 50-1, 50-2 on the chip 20. And, the power electrodes 50-1, 50-2 are connected to the circuit on the surface of the chip 20 by the via holes 71, 72, respectively.

If the chip 20 are divided to the areas 21, 22, 23, 24, and they respectively have different kinds of power supplies, the kind of power connected to the via hole 71 connected to the areas and the kind of power of the power electrode 50-1 and the bonding wire 81 are obviously different. It depends on the application to which the chip 20 is used. And, when the power voltage is same to the power electrodes 50-1 and 50-2 for connecting the capacitor 40 on the back surface of the chip 20, it is not a matter whether the connection is made or not.

Next, the effects of the fourth embodiment will be described with reference to FIG. 11. Note that, in FIG. 11, the parasitic inductances (ESL) relating to the capacitors 40, 41, 49 are ESL11, ESL03, ESL04, respectively. And, the parasitic resistances are ESR11, ESR03, ESR04, respectively.

The equivalent circuit of the semiconductor chip 20 is denoted by 120, and equivalent circuits of the bonding wires 81, 82 are shown by inductances LW1, LW2 and resistances RW1, RW2. And, the inductances LW1, LW2 and the resistances RW1, RW2 are connected in series to the ground (VSS) and power (VDD) in the equivalent circuit 110 of the package 10. Destinations of the connections are shown by the inductances L1, L2. This is an equivalent circuit of the via hole of the package 10. Therefore, the boding wires 81, 82 can be relatively longer than the thickness of the chip, thereby giving a large inductance. As a matter of course, by adjusting the number of bonding wires, an effective inductance can be adjusted. This means that the inductances LW1, LW2 of a current loop 280 from the package 10 to the capacitor 40 can be controlled by the resonance frequency ($\omega 0$) and the Q factor.

An equivalent circuit of the capacitor 40 is shown by the capacitance C11, and the power is supplied to a core circuit in the semiconductor chip 20 via the capacitance C11. The core circuit is shown by the current source (I1) of noise generation along with an operation of the core logic of the semiconductor chip 20 and the on-chip capacitance C01. While current fluctuation along with the operation of the core circuit is shown by the current source (I1), also when the current fluctuates, noise level can be made small even at the resonance frequency by lowering the Q factor of the current loop 211. In other words, the capacitance of the capacitor 40 is increased, and the resistances R11, R12 of the via holes 71, 72 are increased. When taking the resonance frequencies of the current loops 211, 280, 203, 204 as ω211, ω280, ω203, ω204, to operate the semiconductor chip 20 stably, the following condition $$\omega 280 < \omega 211 < \omega 203 < \omega 204 \quad \text{(Equation 8)}$$

is preferable, and they preferably have frequencies different by one digit or more to each other, respectively. In this manner, a power distribution system well balanced to make the noise minimum at any frequency range with respect to mount fluctuations of the semiconductor chip 20 can be achieved. For this purpose, it is important to design the inductance and resistance of each current loop, and especially, the adjustment is easily made by changing the lengths of the bonding wires 81, 82, thereby easing the design.

Figure 11:
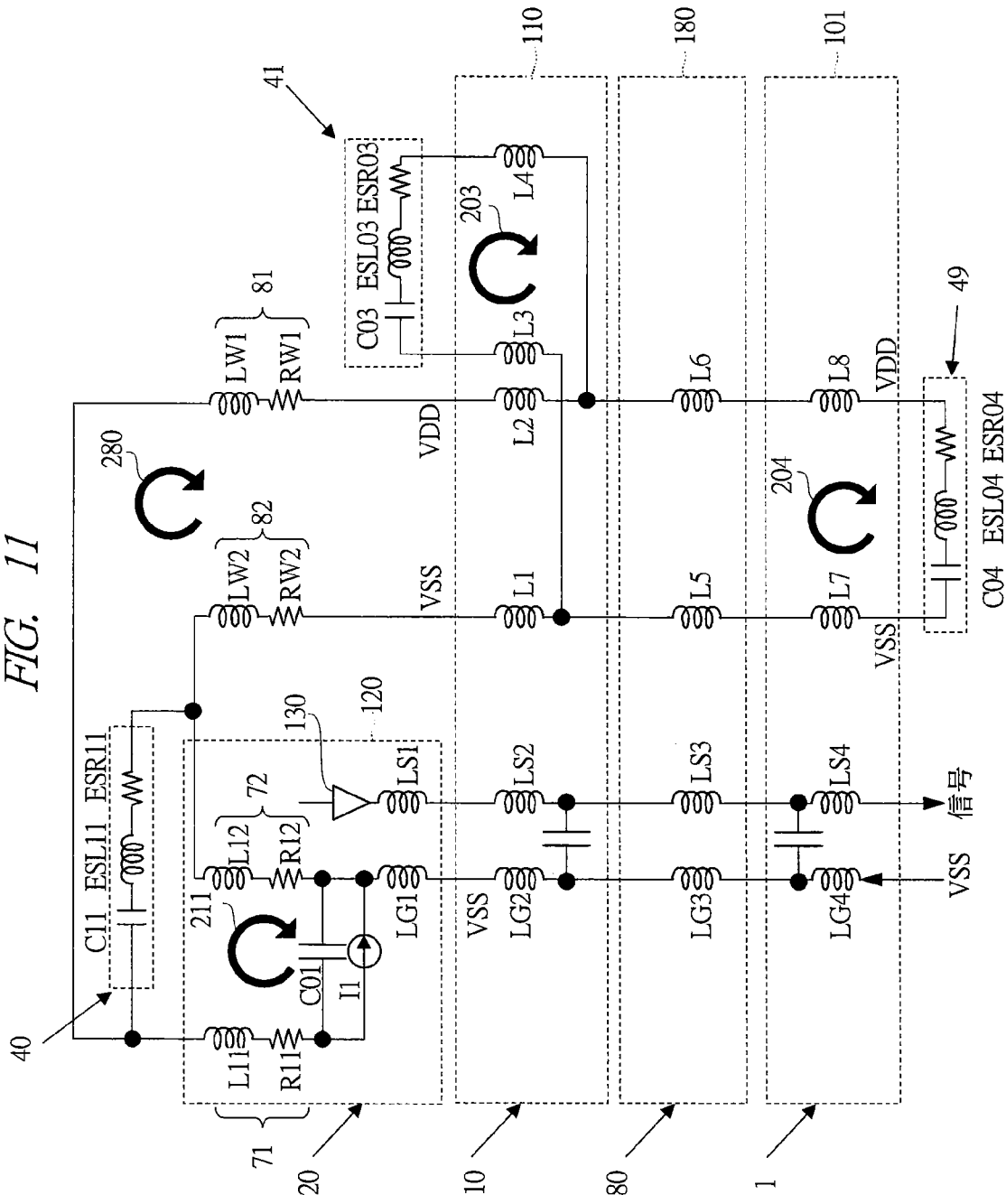
FIG. 11 is an equivalent circuit diagram showing a state where the semiconductor device according to the fourth embodiment of the present invention is mounted to a printed circuit board.

Further, the other mechanism that is C4 solder ball electrically connecting the semiconductor chip 20 and the package 10 is shown by an equivalent circuit of inductances LG1, LS1 in FIG. 11. This is an equivalent circuit of respective solder balls for ground and signal. And, an output circuit (driver) for signal transmission provided in the semiconductor chip 20 is shown by an equivalent circuit 130. The driver outputs signals to the inductance LS2 of the package equivalent circuit 110, the inductance LS3 of the solder ball equivalent circuit 180, and the inductance LS4 of the printed circuit board equivalent circuit 101, and their signal feedback (return) currents flow though the inductance LG1 in the semiconductor chip equivalent circuit 120, the inductance LG2 in the package equivalent circuit 110, the inductance LG3 of the solder ball equivalent circuit 180, and the inductance LG4 of the printed circuit board equivalent circuit 101. And, the directions are opposite to the currents for signals. Further, the pair of signal and ground is connected to electronic devices not shown here such as other LSI signals and a connector. While a connection and operation of the output of the driver (equivalent circuit 130) has been described as to the equivalent circuit 120 of the semiconductor chip 20, there obviously are signal inputs from others than the semiconductor device 9. Also in the case where signals are inputted to the semiconductor chip 20, the signal current flows such that the feedback current paired with the signal flows through the ground. That is, no matter input or output, most parts of the signal current and feedback current flow through the C4 solder ball, not the bonding wire.

Figure 10:
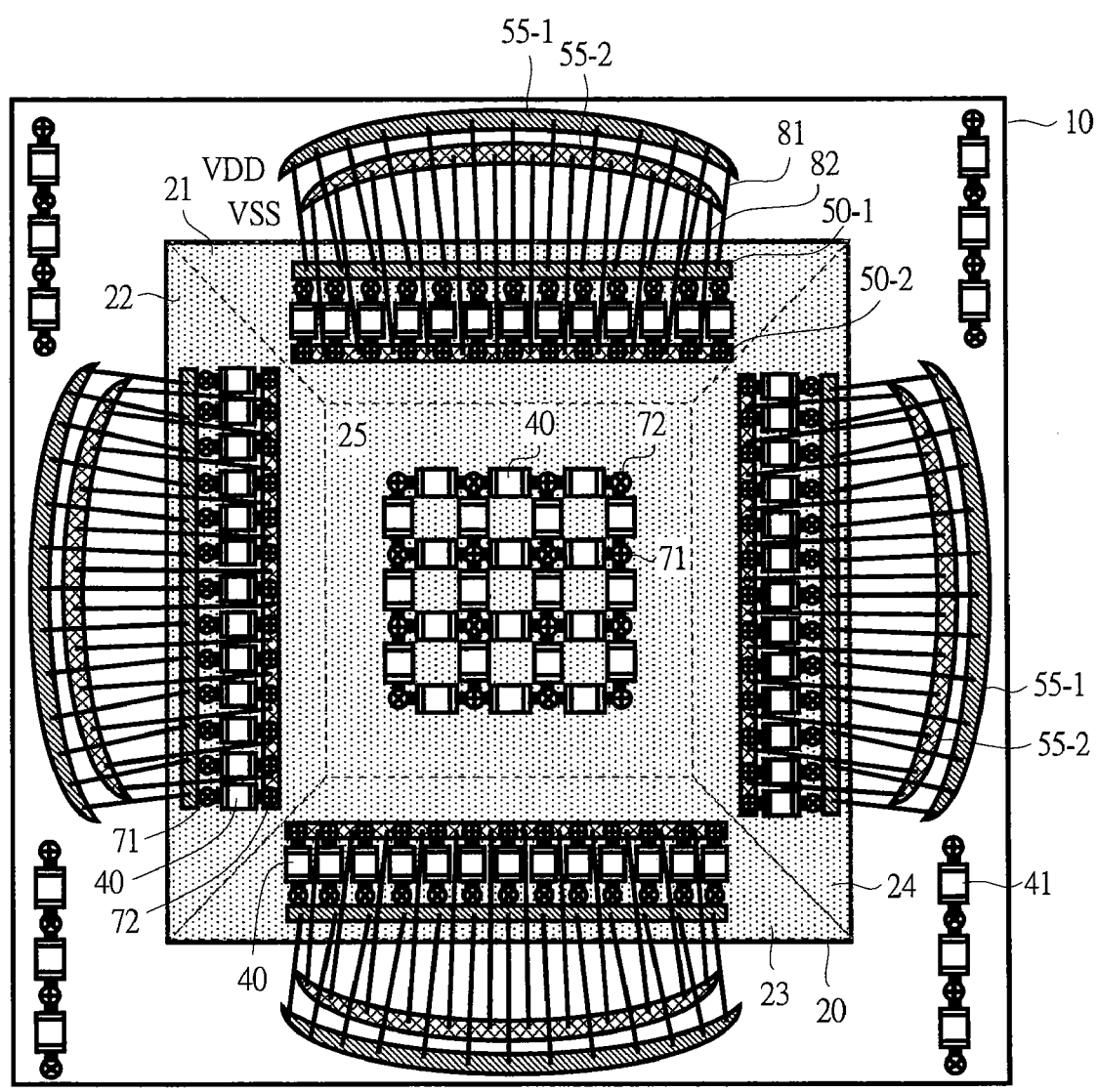
FIG. 10 is a top view showing the semiconductor device according to the fourth embodiment of the present invention.

In this manner, the power of logic circuits in the semiconductor chip 20 is supplied via the bonding wires 81, 82 according to the present embodiment described by FIG. 9 and FIG. 10 having the relationship of electrical connection of FIG. 11, so that the current loop 280 configures an LPF by the inductances LW1, LW2 of the bonding wires 81, 82, and the large-capacitance capacitor 40. Consequently, an LPF can be configured for supplying power to the core circuit as compared with the case of Prior Art in which power supply has been made by the C4 solder ball. Consequently, the C4 solder ball between the semiconductor chip 20 and the package 10 is not necessary to be used for power supply, and thus all the electrodes 51 for the C4 solder ball of the semiconductor chip 20 can be used for the signal and ground for the signal feedback current. Therefore, the number of signals connectable with the semiconductor chip can be increased without increasing the chip area or without narrowing the bump pitch of the C4 solder balls. This obtains effects that the C4 bump which has been necessary for power supply can be further used for signal with respect to the first problem that the number of signal bumps or the number of power bumps is largely limited due to the capacitor.

Further, the inductances LW1, LW2 of the bonding wires 81, 82 and the capacitor 40 configure the LPF, thereby shielding high-frequency power noise propagated from the printed circuit board 1. In reverse, high-frequency power noise generated by the operation of the logic circuit in the semiconductor chip 20 can be also prevented to propagate beneath the package 10. This can be achieved because the capacitor 40 can be mounted on the back surface of the chip without limitation in height, and the large inductances of the bonding wires 81, 82. This obtains large effects when the present embodiment is applied to radio systems similarly to the third embodiment.

Fifth Embodiment

A fifth embodiment of the present invention will be described with reference to FIG. 12 to FIG. 15.

The present embodiment is made by the semiconductor chip of the semiconductor device described in the first to fourth embodiments having a stacked-layer structure, and the semiconductor chips to which via holes are provided are connected in multiple stages, and the capacitor is mounted on a back surface of the uppermost layer semiconductor chip.

Figure 12:
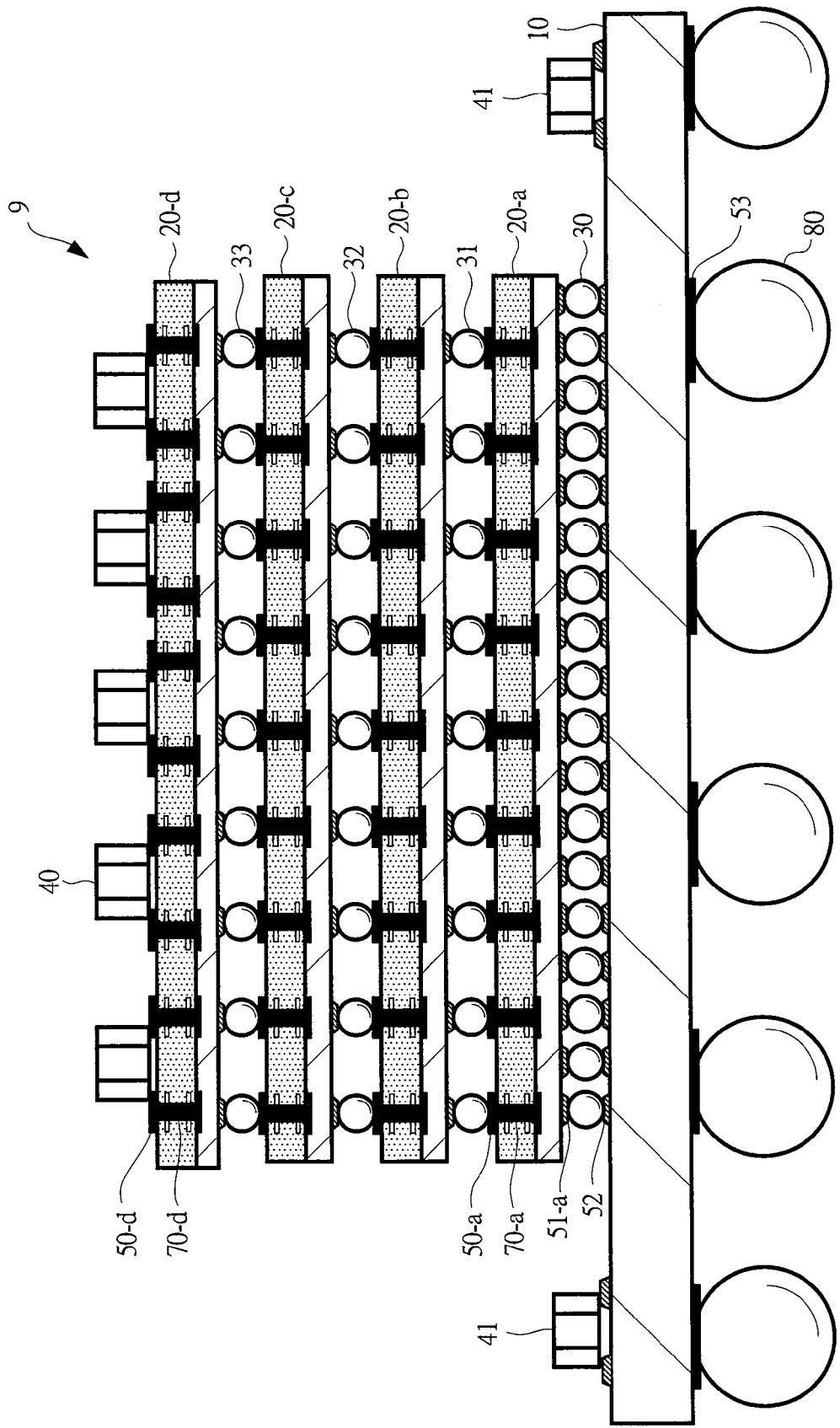
FIG. 12 is a cross-sectional view showing a semiconductor device according to a fifth embodiment of the present invention.

FIG. 12 shows a cross-sectional view of the semiconductor device according to the present embodiment. The semiconductor device shown in FIG. 12 has chips 20-*a* to 20-*d* to which via holes are provided are connected in multiple stages (an example of four stages), and the capacitor 40 is mounted on the back surface of the uppermost layer chip 20-*d*. The uppermost layer chip 20-*d* does not need the via hole for signal.

An electrode 51-*a* of the semiconductor 20-*a* is connected to the package 10 via the C4 solder ball 30. A via hole 70-*a* is formed to the chip 20-*a*, and the via hole is electrically connected to an electrode 50-*a* on the back surface of the chip 20-*a*. The chip 20-*a* has the electrode 50-*a* not only for power but also for signal. The second chip 20-*b* is further connected on the electrode 50-*a* via a solder ball 31. The chip 20-*b* also has a via hole, and connected with the third chip 20-*c* via a solder ball 32, and the fourth chip 20-*d* via a solder ball 33.

The uppermost layer chip of such the semiconductor device 9 having a 3D stacked structure is denoted by 20-*d*. The chip 20-*d* also has a via hole 70-*d* and an electrode 50-*d* formed thereto, and the capacitor 40 is connected to the electrode 50-*d*.

In the semiconductor device of the 3D stacked structure, conditions of power environment of the uppermost layer chip 20-*d* is the worst. The first reason of this is an iR drop due to resistance components of the wiring and via holes in the chips 20-*a* to 20-*d*. The second reason is inducted noise due to inductances by power wirings and via holes in respective chips. This poses a problem that charges cannot be supplied even when a capacitor 41 is mounted on the package 10 because the uppermost layer chip 20-*d* is too far electrically.

While the capacitor 40 mounted on the back surface of the chip 20-*d* has no effect to the iR drop among noises, it has an effect of reducing the induced noise. This is because the large-capacitance capacitor 40 having no limitation in height can be mounted to a part closest to the chip 20-*d* even though the chip 20-*d* is farthest from the capacitor 41 of the package 10 and they form an LPF, as discussed in the first to fourth embodiments.

Figure 13:
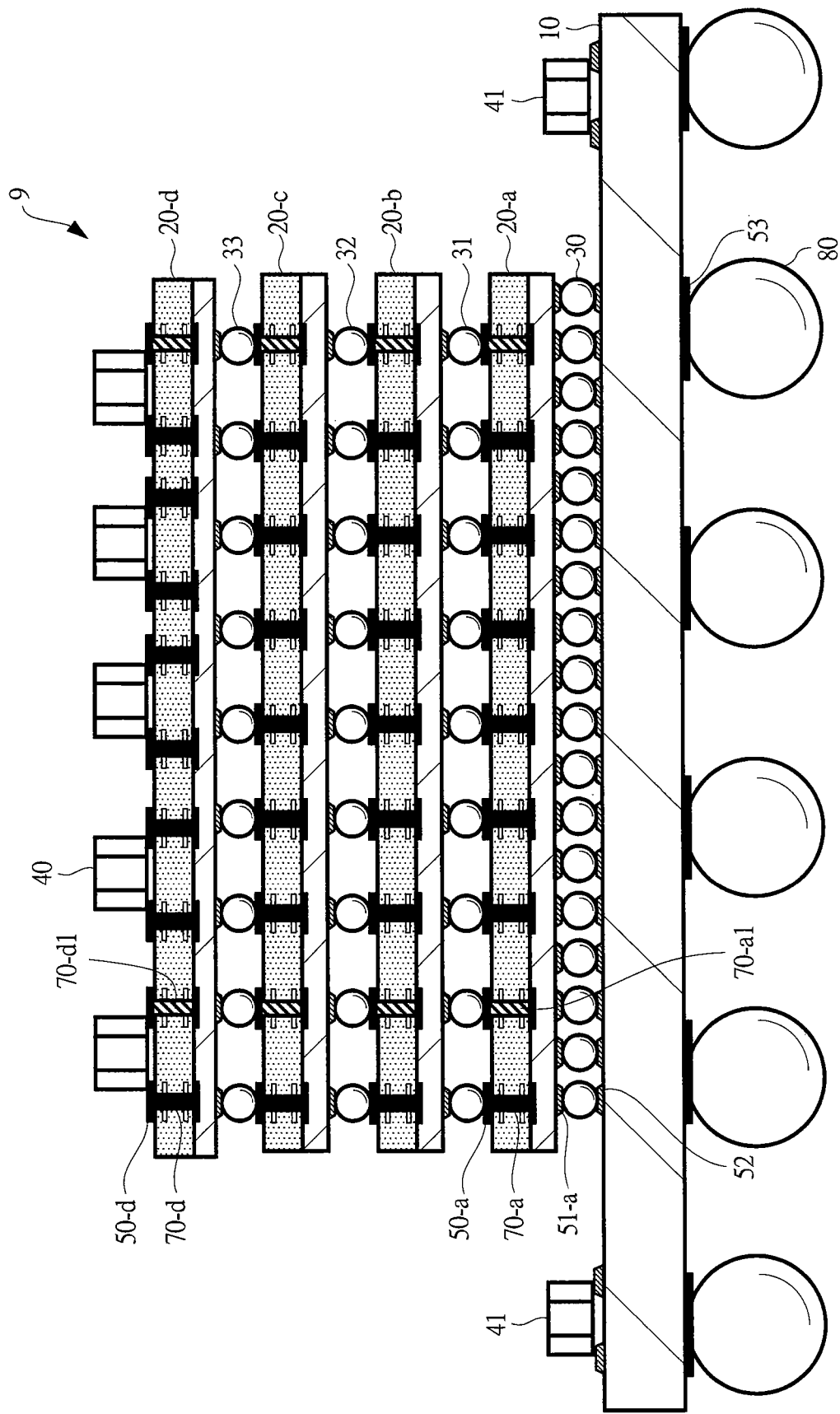
FIG. 13 is a cross-sectional view showing another semiconductor device according to the fifth embodiment of the present invention.

Further, as the semiconductor device shown in FIG. 13, the Q factor can be controlled by changing the resistance value of the via hole. 70-*a* and 70-*a*1 in FIG. 13 are via holes of the chip 20-*a*, and the via hole 70-*a* is for signal and made of a low-resistance material. And, the via hole 70-*a*1 is made of a high-resistance material, and thus has a larger resistance value than the via hole 70-*a*. In addition, similarly, a via hole 70-*a*1 and a via hole 70-*d* of the chip 20-*d* have different resistance values.

A low-resistance via hole can be formed for signal in the chips 20-*a*, 20-*b*, 20-*c* not mounting the capacitor 40, and a high-resistance via hole can be formed for a via hole for power supply. In this case, since the via hole (e.g., 70-*d*1) has a high resistance, there are effects that the Q factor of a current loop of the chip 20-*d* can be reduced and the noise at the resonance frequency can be reduced. And, to control the Q factor adequately, giving the power-supply via hole 70-*d*1 a different resistance than that of the signal via hole 70-*d*, or adjusting the number of the power via hole 70-*d*1 enables Q-factor control.

Figure 14:
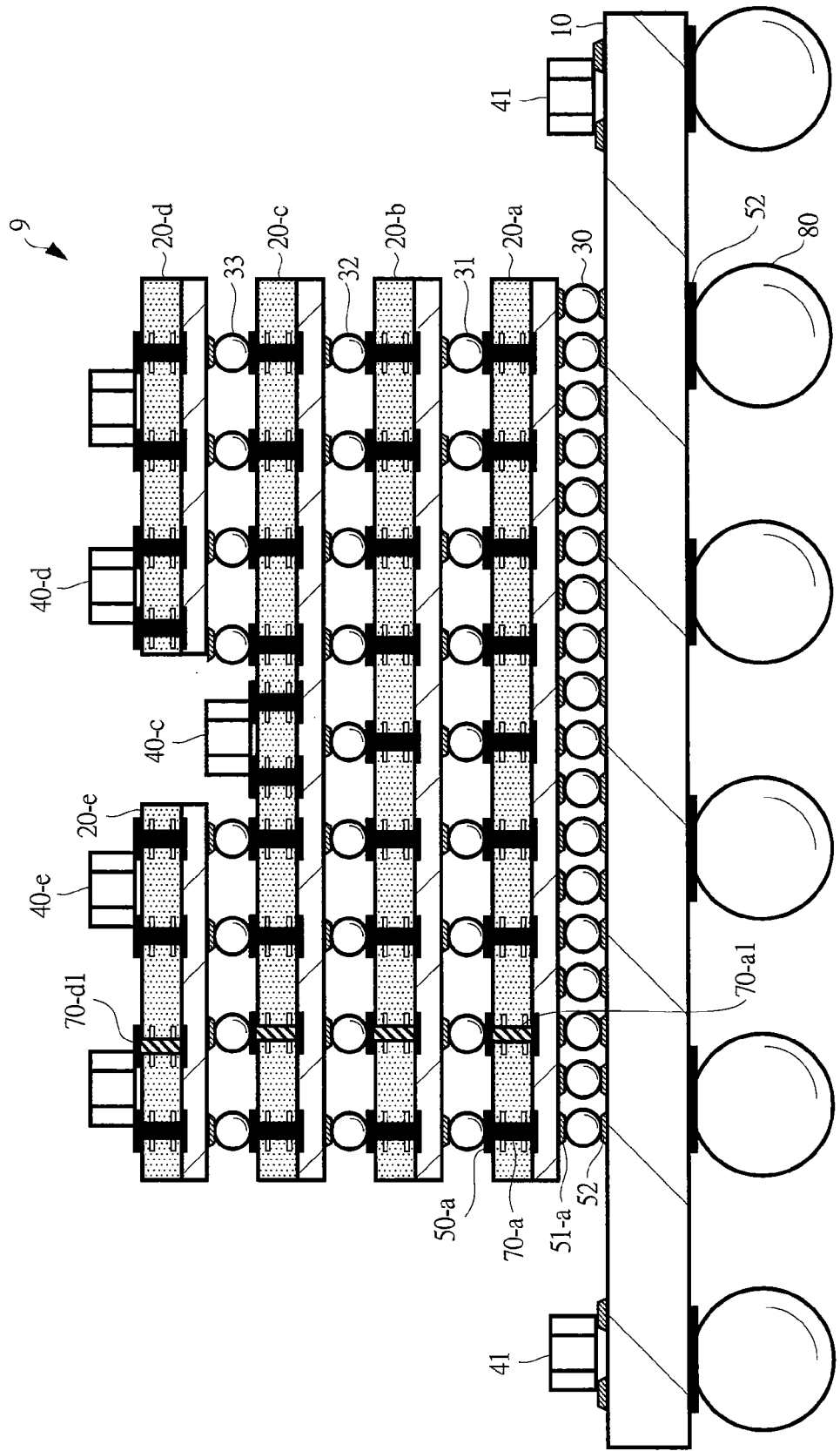
FIG. 14 is a cross-sectional view showing still another semiconductor device according to the fifth embodiment of the present invention.

Similarly, even by a 3D stacked-layer mounting like the semiconductor device shown in FIG. 14, similar effects can be obtained. That is, while every chip of the chips 20-*a* and 20-*b* has one chip mounted thereon, two chips of 20-*d* and a chip 20-*e* are mounted on the chip 20-*c*. Capacitors 40-*d* and 40-*e* are mounted on back surfaces of the chips 20-*d* and 20-*e* via holes. And, a capacitor 40-*c* is mounted to the chip 20-*c* via a via hole. The capacitor 40-*c* is mounted to a gap between the chip 20-*d* and the chip 20-*e*, and the capacitor 40-*c* does not also have a limitation in height.

According to mounting a capacitor between chips in this manner, capacitors can be mounted not only on the uppermost layer chips 20-*d* and 20-*e* but also on the back surfaces of chips under the chips 20-*d* and 20-*e*. This obviously obtains an effect of reducing power-supply noise of the chips 20-*c*, 20-*d*, 20-*e* as compared with the case where only the capacitor 41 is mounted on the package 10. Also in this case, the capacitor is not mounted at the same position as the C4 solder balls, and thus it is not needless to say that the number of C4 pads on the chip circuit surface is not limited.

Figure 15:
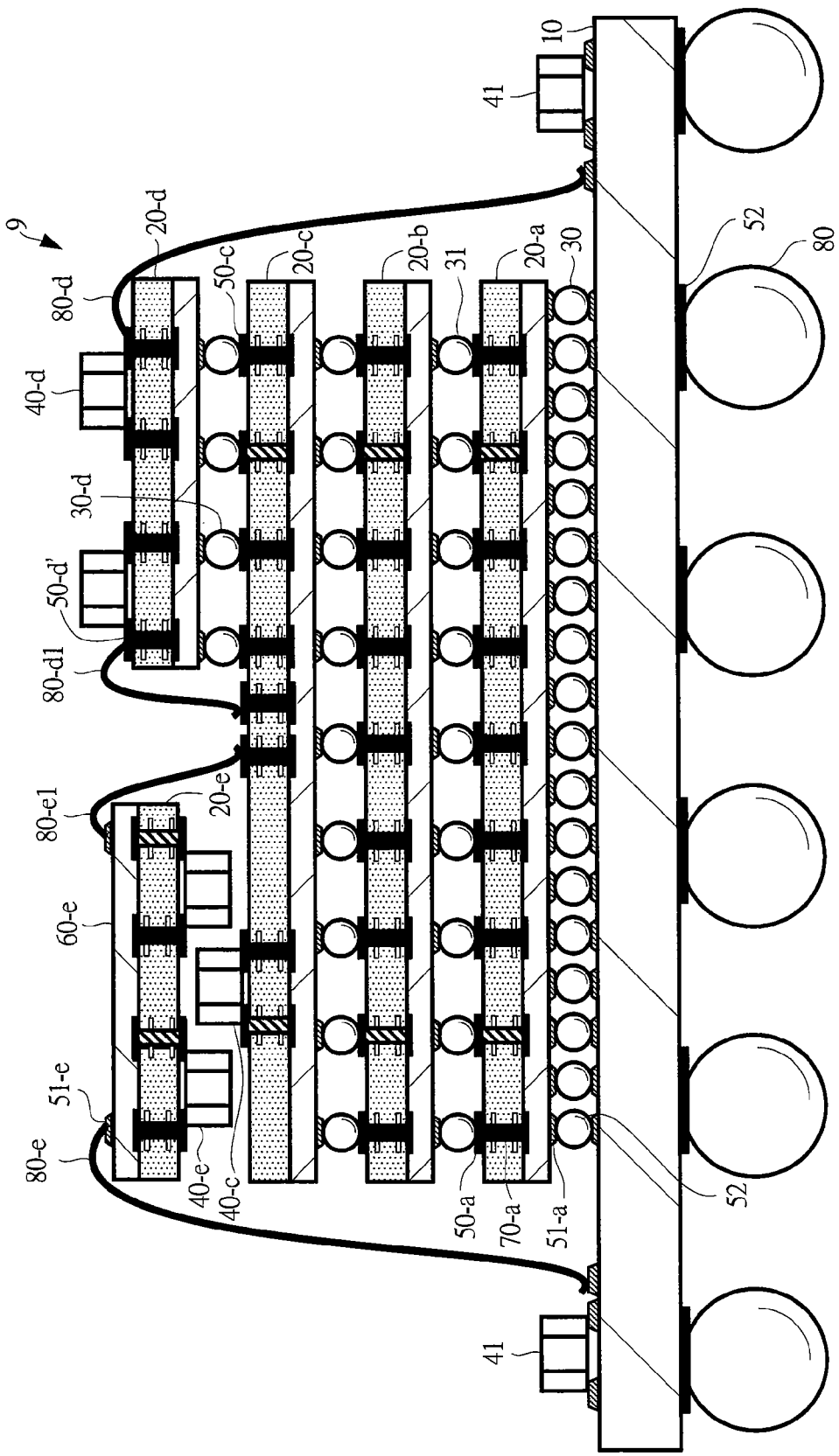
FIG. 15 is a cross-sectional view showing the other semiconductor device according to the fifth embodiment of the present invention.

Further, like the semiconductor device shown in FIG. 15, the first to fourth embodiments can be combined. That is, the chip 20-*a* is connected to the package 10 via the C4 solder ball 30. The via hole 70-*a* is formed in the chip 20-*a*, and the via hole 70-*a* is connected to the electrode 50-*a* on the back surface of the chip 20-*a*. Here, there are not only the electrode 50-*a* for power supply but also for signal. The second chip 20-*b* is further connected on the electrode 50-*a* via the solder ball 31. The chip 20-*b* also has a via hole, and the third chip 20-*c* is further connected thereto.

A via hole is formed also in the chip 20-*c*, and the electrode 50-*c* is formed on the back surface of the chip 20-*c*. The signal and the ground for signal current feedback of the chip 20-*d* are connected via the electrode 50-*c* and the C4 solder ball 30-*d*. The power of the chip 20-*d* is directly supplied from the package 10 by a bonding wire 80-*d*. And, the capacitor 40-*d* and the bonding wire 80-*d* configure an LPF, thereby reducing high-frequency power noise to the chip 20-*d* or to the external from the chip 20-*d*.

Further, by connecting power supply to an electrode 50-*d*′ on the back surface of the chip 20-*d* by a bonding wire 80-*d*1 as necessary, a stable power supply to the chip 20-*c* is also enabled. That is, the signal and the feedback current flow through the C4 solder ball 30-*d*, and the power supply having the LPF formed by the bonding wire 80-*d*1 and the capacitor 40-*d* is further supplied to the chip 20-*c* by the bonding wire 80-*d*, and the capacitor 40-*c* mounted on the chip 20-*c* configures an LPF, thereby enabling a stabled power supply.

Still further, the chip 20-*e* has a circuit wiring layer 60-*e* facing upwards in FIG. 15, and fixed by a material like a mold or sheet not shown in FIG. 15. The fixing material does not give a large influence to the present embodiment. An electrode 51-*e* is formed on a surface of the wiring layer 60-*e* of the chip 20-*e*, and the electrode 51-*e* and the package 10 are connected by a bonding wire 80-*e*. The chip 20-*e* is not connected by a C4 solder ball, and both the signal and power are connected to the package 10 by the bonding wire 80-*e*. And, a via hole is formed in the chip 20-*e*, and an electrode is formed on the back surface of the chip, so that a capacitor 40-*e* is mounted thereon. In this manner, the bonding wire 80-*e* bonding-connected to the same surface of the wiring layer 60-*e* of the chip 20-*e*, and thus the capacitor 40-*e* connected by the via hole is not mounted on the same plane even when the signal and power are supplied, thereby obtaining the same effect as that of the foregoing embodiments that the position of electrode for bonding wire is not limited.

Moreover, the signal and power of the chip 20-*e* can be connected to the electrode 50-*c* on the back surface of the chip 20-*c* by a bonding wire 80-*e*1 as necessary. In this manner, not only the bonding wire 80-*e* but also the bonding wire 80-*e*1 can be used, and thus the heights of the capacitors 40-*e*, 40-*c* mounted to the chip 20-*e* are not limited, thereby enabling an increase of capacitance.

In addition, as a further effect, by freely combining the via hole, bonding wire, and capacitor, LPFs using large-capacitance capacitors can be made to various positions in the chips in the semiconductor device 9, thereby achieving lower power noise in each chip. As a still further effect, since the number of balls for power supply can be reduced by the package 10 or the C4 solder ball 30, so that an effect of increasing the number of signal lines at a low cost can be obtained.

As a method of solving the fourth problem, a material having a large resistance component is used for the power via hole 70 in the chip 20, thereby making the Q factor small. However, a material having a low resistance is used for the signal via hole, thereby preventing the signal amplitude of the signal from lowering. In this manner, by preparing two kinds of via holes such as a high-resistance via hole for the power capacitor and a low-resistance via hole for the signal capacitor, there are effects that it is possible to apply a stable power supply by the LPF of the power distribution system and designing low Q factor, and deteriorations of signal is few because the signal is connected by the low-resistance via hole. The same thing is given to the following discussion.

Sixth Embodiment

A sixth embodiment of the present invention will be described with reference to FIG. 16.

The present embodiment is an example where the semiconductor devices of the first to fifth embodiments are applied to configure an information processing system.

Figure 16:
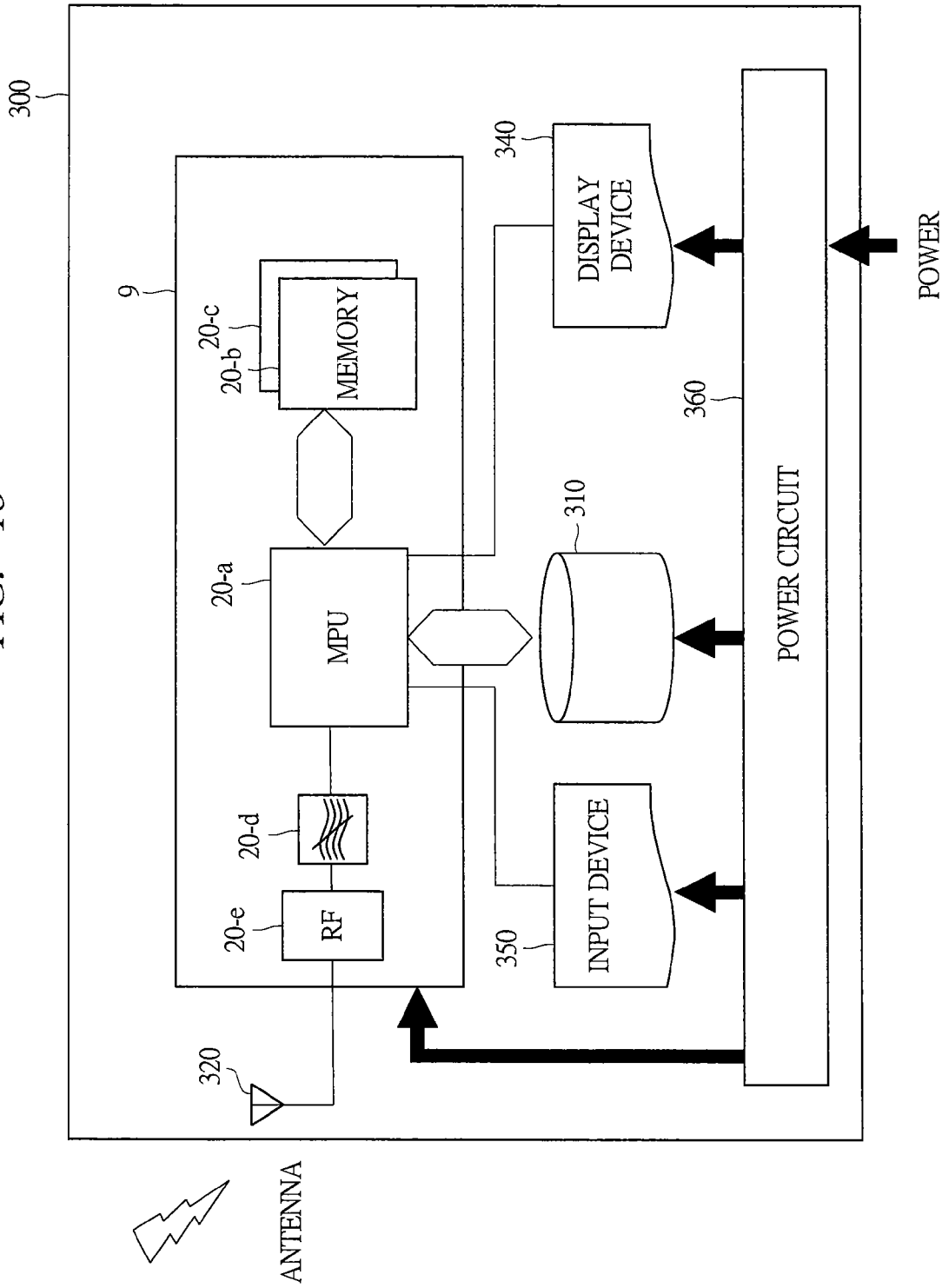
FIG. 16 is a configuration diagram showing an information processing system configured by applying a semiconductor device according to a sixth embodiment of the present invention.
Figure 17:
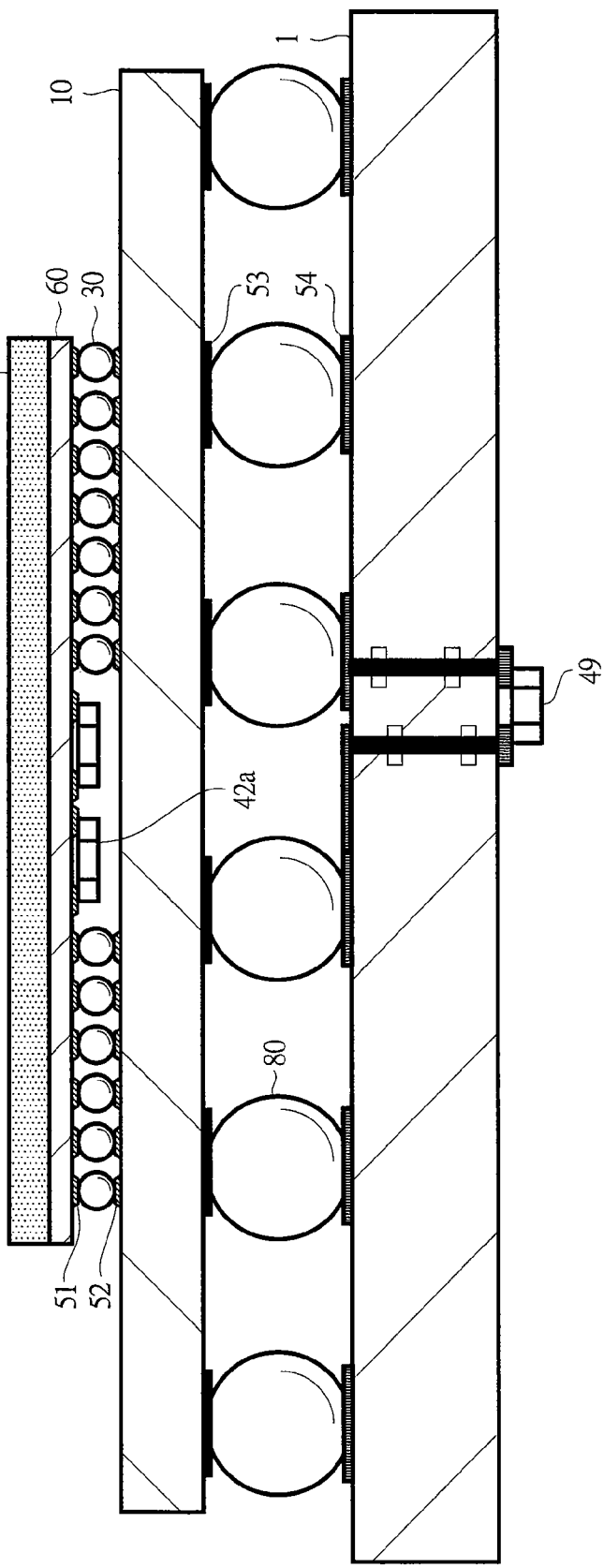
FIG. 17 is a cross-sectional view showing a semiconductor device of Prior Art 1 with respect to the present invention.

FIG. 16 shows the information processing system according to the present embodiment. An information processing system 300 comprises the semiconductor device 9, a storage device 310, an input device 350, a display device 340, an antenna 320, and a power circuit 360 including a battery. The chip 20-*a* of an arithmetic processing circuit (MPU), the chips 20-*b*, 20-*c* of a memory circuit, the chip 20-*d* of an analog circuit, and the chip 20-*e* of a radio circuit (RF) are mounted to the semiconductor device 9. These chips 20-*a* to 20-*e* have via holes inside thereof, and capacitors not shown here are mounted to the back surfaces of the chips. And, power is supplied to the chips from the power circuit 360 via the package in the semiconductor device 9.

The semiconductor device 9 is connected by wirings so as to transmit and receive signals with the storage device 310, display device 340, antenna 320, and input device 350. The information processing system 300 performs information processings according to instruction stored in the storage device 310 by data through the input device 350 and the antenna 320, and transmits the processed data through the antenna 320 or displays the data to the display device 340.

Since the semiconductor device 9 is configured such as the first to fifth embodiments, the number of electrodes for connections formed on the circuit surfaces of the chips 20-*a* to 20-*e* can be small, thereby obtaining effects of reducing the sizes of the chips 20-*a* to 20-*e* themselves and lowering cost. Further, since the capacitor 40 mounted to the chips 20-*a* to 20-*e* configures LPFs, an effect of mounting further less capacitances for stabling the power supply to the power circuit can be obtained.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor chip and the semiconductor device mounting the semiconductor chip of the present invention is applicable to semiconductor devices mounting functional circuits and application products thereof including information processing devices such as a personal computer, serve, router and storage, and processors and memories to be embedded in information home appliances such as in-vehicle information terminal, television and camera. More particularly, since the semiconductor device of the present invention mounts a capacitor on a back surface of a chip, not only increasing the number of electrodes of the chip but also achieving a stable power supply supplied to the chip. It is also has same effects in a semiconductor device mounting multiple chips of a 3D stacked type. Therefore, it is preferable to be applied to mobile devices having a limitation in mounting area.

What is claimed is:

1. A semiconductor chip comprising:
a circuit for configuring an information processing function and a plurality of power electrodes for supplying power,
wherein a multilayered wiring pattern of the circuit is formed on a surface of the semiconductor chip,
wherein at least one said power electrode is formed on a predetermined layer of the circuit on the surface of the semiconductor chip and at least one other said power electrode is formed on a back surface of the semiconductor chip,
wherein the at least one power electrode formed on the circuit on the surface of the semiconductor chip and the at least one other power electrode formed on the back surface of the semiconductor chip are electrically connected through a first via hole provided inside the semiconductor chip,
wherein one or more capacitors having a high-dielectric insulating layer are connected to the power electrode of the back surface of the semiconductor chip,
wherein a number of the power electrodes provided on the back surface of the semiconductor chip is an even number equal to or larger than four,
wherein said one or more capacitors having the high-dielectric insulating layer are connected to the power electrodes of the back surface of the semiconductor chip so that different kinds of power voltages are applied to terminals of the capacitors,
wherein a number of the capacitors is equal to or larger than two, and the power electrodes of adjacent capacitors are arranged so that currents flow in the power electrodes antiparallel to each other,
wherein the circuit includes a plurality of first functional blocks having different kinds of power supplies,
wherein the circuit includes a plurality of second functional blocks having a same power voltage,
wherein a first power electrode connected to a power supply of one of said first functional blocks is formed in a first area of the surface of the semiconductor chip,
wherein a second power electrode connected to a power supply of one of said second functional blocks is formed in a second area of the surface of the semiconductor chip,
wherein a third power electrode and a fourth power electrode are formed on the back surface of the semiconductor chip,
wherein the first via hole and a second via hole are formed inside the semiconductor chip,
wherein a pair comprising the power supply of the first functional block and a ground, and an electrode pair comprising the first power electrode and a ground electrode formed on the back surface of the semiconductor chip, are electrically connected through the first via hole,
wherein a pair comprising the power supply of the second functional block and a ground, and an electrode pair comprising the second power electrode and a ground electrode formed on the back surface of the semiconductor chip, are electrically connected through the second via hole,
wherein the capacitors having the high-dielectric insulating layer are connected between the electrode pair comprising the first power electrode and the ground electrode and between the pair comprising the second power supply and the ground on the back surface of the semiconductor chip, and wherein a power electrode of the electrode pair of the first power electrode and a power electrode of the electrode pair of the second power electrode and the ground electrode are wired to be electrically insulated on the back surface of the semiconductor chip to prevent propagation of noise between said first and second areas.

* * * * *